United States Patent
Goda et al.

(10) Patent No.: US 10,734,399 B2
(45) Date of Patent: Aug. 4, 2020

(54) MULTI-GATE STRING DRIVERS HAVING SHARED PILLAR STRUCTURE

(71) Applicant: Micron Technology, Inc., Boise, ID (US)

(72) Inventors: Akira Goda, Boise, ID (US); Haitao Liu, Boise, ID (US); Jin Chen, Boise, ID (US); Guangyu Huang, Boise, ID (US); Mojtaba Asadirad, Boise, ID (US)

(73) Assignee: Micron Technology, Inc., Boise, IA (US)

( * ) Notice: Subject to any disclaimer, the term of this patent is extended or adjusted under 35 U.S.C. 154(b) by 1 day.

(21) Appl. No.: 15/858,509

(22) Filed: Dec. 29, 2017

(65) Prior Publication Data

US 2019/0206889 A1    Jul. 4, 2019

(51) Int. Cl.
*H01L 27/11573* (2017.01)
*H01L 27/11582* (2017.01)
(Continued)

(52) U.S. Cl.
CPC .... *H01L 27/11573* (2013.01); *G11C 16/0483* (2013.01); *G11C 16/08* (2013.01); *G11C 16/24* (2013.01); *H01L 21/02532* (2013.01); *H01L 21/02639* (2013.01); *H01L 21/02667* (2013.01); *H01L 23/528* (2013.01); *H01L 23/53271* (2013.01); *H01L 27/11526* (2013.01); *H01L 27/11556* (2013.01); *H01L 27/11582* (2013.01); *H01L 29/04* (2013.01); *H01L 29/16* (2013.01); *H01L 29/36* (2013.01); *H01L 29/66666* (2013.01); *H01L 29/7827* (2013.01); *G11C 16/10* (2013.01); *G11C 16/14* (2013.01);
(Continued)

(58) Field of Classification Search
CPC ..... G11C 16/10; G11C 16/26; G11C 16/0483; H01L 27/11524; H01L 27/11529; H01L 27/11556; H01L 27/1157; H01L 27/11573; H01L 27/11582; H01L 27/11526
See application file for complete search history.

(56) References Cited

U.S. PATENT DOCUMENTS 9,595,535 B1 * 3/2017 Ogawa ............. H01L 27/11582
9,679,650 B1 * 6/2017 Sakui ................ H01L 27/11524
(Continued)

*Primary Examiner* — Zandra V Smith
*Assistant Examiner* — Jeremy J Joy
(74) *Attorney, Agent, or Firm* — Schwegman Lundberg & Woessner, P.A.

(57) ABSTRACT

Some embodiments include apparatuses, and methods of forming the apparatuses. Some of the apparatuses include a first group of conductive materials interleaved with a first group of dielectric materials, a pillar extending through the conductive materials and the dielectric materials, memory cells located along the first pillar, a conductive contact coupled to a conductive material of the first group of conductive materials, and additional pillars extending through a second group of conductive materials and a second group of dielectric materials. The second pillar includes a first portion coupled to a conductive region, a second portion, a third portion, and a fourth portion coupled to the conductive contact. The second portion is located between the first and third portions. The second portion of each of the additional pillars is part of a piece of material extending from a first pillar to a second pillar of the additional pillars.

21 Claims, 23 Drawing Sheets

(51) Int. Cl.

| | |
|---|---|
| *H01L 27/11578* | (2017.01) |
| *H01L 27/11556* | (2017.01) |
| *H01L 27/11551* | (2017.01) |
| *H01L 27/11526* | (2017.01) |
| *G11C 16/26* | (2006.01) |
| *G11C 16/24* | (2006.01) |
| *G11C 16/14* | (2006.01) |
| *G11C 16/10* | (2006.01) |
| *H01L 23/528* | (2006.01) |
| *H01L 29/36* | (2006.01) |
| *H01L 29/04* | (2006.01) |
| *H01L 21/02* | (2006.01) |
| *H01L 29/78* | (2006.01) |
| *H01L 29/66* | (2006.01) |
| *H01L 29/16* | (2006.01) |
| *H01L 23/532* | (2006.01) |
| *G11C 16/08* | (2006.01) |
| *G11C 16/04* | (2006.01) |
| *H01L 29/08* | (2006.01) |

(52) U.S. Cl.
CPC .......... *G11C 16/26* (2013.01); *H01L 23/5329* (2013.01); *H01L 29/0847* (2013.01)

(56) References Cited

U.S. PATENT DOCUMENTS

| | | | |
|---|---|---|---|
| 9,780,110 B2* | 10/2017 | Tanzawa | G11C 16/10 |
| 10,170,194 B1* | 1/2019 | Huang | G11C 16/26 |
| 2009/0230449 A1* | 9/2009 | Sakaguchi | H01L 27/0688 |
| | | | 257/298 |
| 2010/0207186 A1* | 8/2010 | Higashi | H01L 27/11582 |
| | | | 257/314 |
| 2013/0130468 A1* | 5/2013 | Higashitani | H01L 29/7926 |
| | | | 438/382 |
| 2015/0093897 A1* | 4/2015 | Koh | H01L 27/11286 |
| | | | 438/671 |
| 2019/0067475 A1* | 2/2019 | Liu | H01L 29/66969 |

* cited by examiner

700

MULTI-GATE STRING DRIVERS HAVING SHARED PILLAR STRUCTURE

BACKGROUND

Memory devices are widely used in computers, cellular phones, and many other electronic items. A conventional memory device, such as a 3D (three-dimensional) flash memory device, has many memory cells to store information. A memory device has conductive lines and circuitry to provide voltages to the conductive lines in order to access the memory cells during different memory operations. Such circuitry often includes drivers (e.g., switches) to pass voltages from a voltage source to respective conductive lines. Some memory operations may use a relatively high voltage (e.g., ten to 20 times the operating voltage of the memory device). Many conventional drivers are designed to sustain such a high voltage. However, some memory devices may use even higher voltage in some of their operations. Such a higher voltage may make some conventional drivers unreliable. Further, some of such conventional drivers may have limited current mobility and high resistance. Therefore, designing drivers to support a higher voltage and address the mentioned current mobility of driver resistance may add complexity to peripheral circuitry associated with conventional drivers.

DETAILED DESCRIPTION

Figure 1:
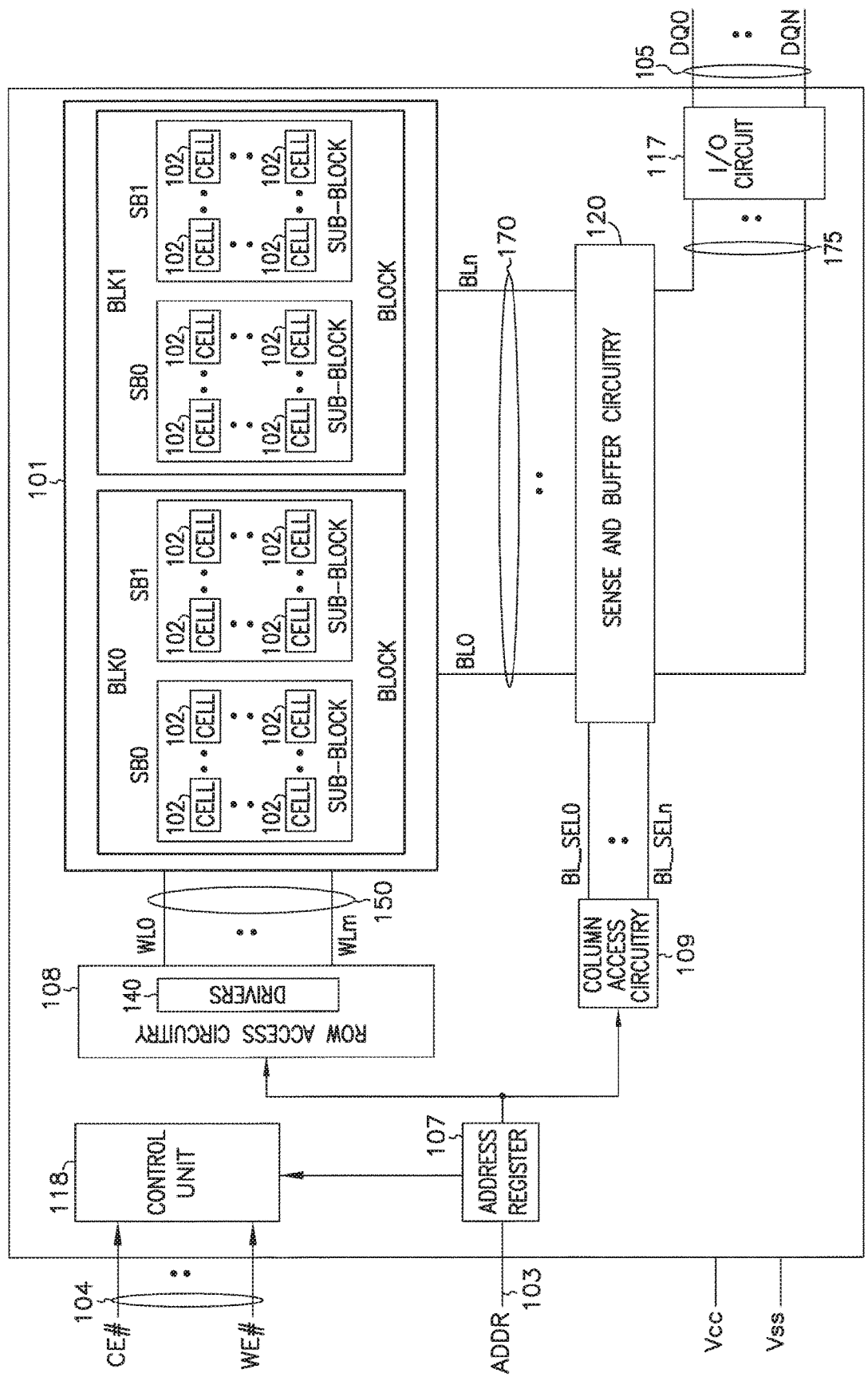
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks BLK0 and BLK1. Each of blocks BLK0 and BLK1 can include its own sub-blocks, such as sub-blocks SB0 and SB1. In the physical structure of memory device 100, memory cells 102 can be arranged vertically (e.g., stacked over each other) over a substrate (e.g., a semiconductor substrate) of memory device 100. FIG. 1 shows memory device 100 having two blocks BLK0 and BLK1 and two sub-blocks in each of the blocks as an example. Memory device 100 can have more than two blocks and more than two sub-blocks in each of the blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks BLK0 and BLK1 and data lines 170 to selectively exchange information (e.g., data) with memory cells 102 of blocks BLK0 and BLK1.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks BLK0 and BLK1 are to be accessed during a memory operation. Memory device 100 can include drivers (driver circuits) 140, which can be part of row access circuitry 108. Drivers 140 can include the drivers described in more detail with reference to FIG. 2 through FIG. 17. Drivers 140 can operate (e.g., operate as switches) to form (or not to form) conductive paths (e.g., current paths) between nodes providing voltages and respective access lines 150 during operations of memory device 100.

Memory device 100 can perform a read operation to read (e.g., sense) information (e.g., previously stored information) from memory cells 102 of blocks BLK0 and BLK1, or a write (e.g., programming) operation to store (e.g., program) information in memory cells 102 of blocks BLK0 and BLK1. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks BLK0 and BLK1.

Memory device 100 can include a control unit 118 that can be configured to control memory operations of memory device 100 based on control signals on lines 104. Examples of the control signals on lines 104 include one or more clock signals and other signals (e.g., a chip enable signal CE #, a write enable signal WE #) to indicate which operation (e.g., read, write, or erase operation) memory device 100 can perform.

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks BLK0 and BLK1 and provide the value of the information to lines (e.g., global data lines) 175. Sense and buffer circuitry 120 can also be configured to use signals on lines 175 to determine the value of information to be stored (e.g., programmed) in memory cells 102 of blocks BLK0 and BLK1 (e.g., during a write operation) based on the values (e.g., voltage values) of signals on lines 175 (e.g., during a write operation).

Memory device 100 can include input/output (I/O) circuitry 117 to exchange information between memory cells 102 of blocks BLK0 and BLK1 and lines (e.g., I/O lines) 105. Signals DQ0 through DQN on lines 105 can represent information read from or stored in memory cells 102 of blocks BLK0 and BLK1. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one hit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "011", "011", "100", "101", "110", and "111" of three hits, or one of other values of another number of multiple hits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive Random Access Memory (RAM) device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 17.

Figure 2:
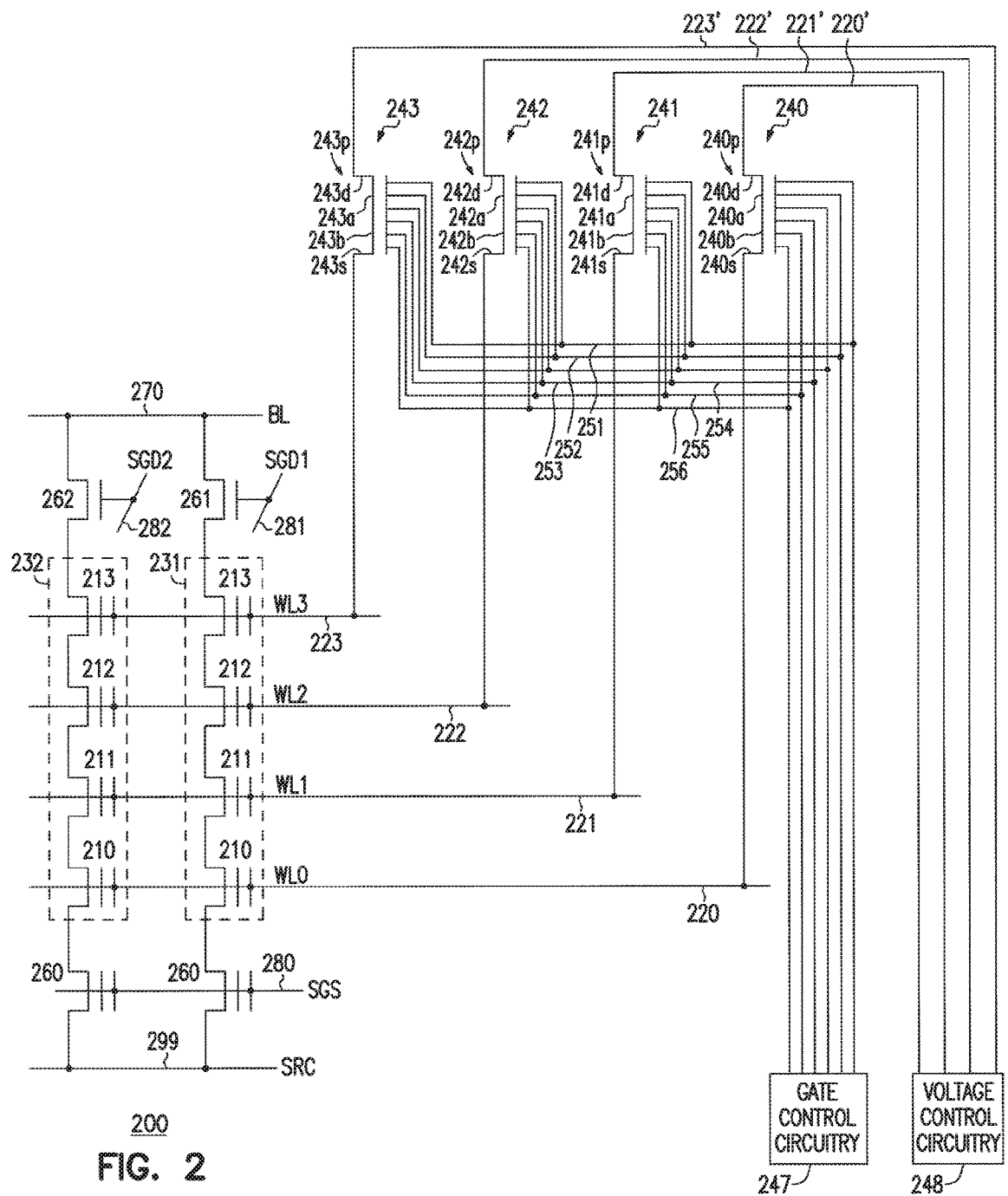
FIG. 2 shows a block diagram of a portion of a memory device including memory cell strings and drivers (e.g., driver circuits), according to some embodiments described herein.

FIG. 2 shows a block diagram of a portion of a memory device 200 including memory cell strings 231 and 232 and drivers (e.g., driver circuits) 240, 241, 242, and 243, according to some embodiments described herein. Memory device 200 can correspond to memory device 100 of FIG. 1. For example, memory cell strings 231 and 232 can be part of a memory array of FIG. 2 that can correspond to memory array 101 of FIG. 1, and drivers 240, 241, 242, and 243 can correspond to drivers 140 of FIG. 1.

Memory device 200 can include a data line 270 that carry a signal (e.g., bit line signal) BL0. Data line 270 can be structured as a conductive line (which includes conductive material). The memory cell strings 231 and 232 can share data line 270. FIG. 2 shows an example of one data line 270 of memory device 200. However, memory device 200 can include numerous data lines.

Memory device 200 can include a line 299 that can carry a signal SRC (e.g., source line signal). Line 299 can be structured as a conductive line (which includes conductive materials) and can form part of a source (e.g., a source line) of memory device 200.

As shown in FIG. 2, memory device 200 can include memory cells 210, 211, 212, and 213; select gates (e.g., drain select gates or transistors) 261 and 262; and select gates (e.g., source select gates or transistors) 260. Memory device 200 can include select lines (e.g., drain select lines) 281 and 282 to control (e.g., turn on or turn off) select gates 261 and 262, respectively, and a select line (e.g., source select line) 280 to control (e.g., turn on or turn off) select gates 260.

Each of memory cell strings 231 and 232 can include one of memory cells 210, one of memory cells 211, one of memory cells 212, and one of memory cells 213. Memory cells 210, 211, 212, and 213 in a respective memory cell string are coupled in series between a respective drain select gate (e.g., select gate 261 or 262) and a respective source select gates (e.g., one of select gates 260).

FIG. 2 shows an example of four memory cells 210, 211, 212, and 213 in each memory cell string. The number of memory cells in each of memory cell strings 231 and 232 can vary. FIG. 2 shows an example of two memory cell strings and associated select gates (e.g., drain and source select gates) coupled between data line 270 and line 299 to help focus on the embodiments described herein. However, memory device 200 can include numerous memory cell strings and their select gates coupled between data line 270 and line 299.

Memory device 200 can include access lines 220, 221, 222, and 223, which can be local access lines (e.g., a group of local word lines) that can carry corresponding signals (e.g., local word line signals) $WL0_0$, $WL1_0$, $WL2_0$, and $WL3_0$.

Memory device 200 can include access lines 220', 221', 222', and 223', which can be global access lines (e.g., a group of global word lines) that can carry corresponding signals (e.g., global word line signals) V0, V1, V2, and V3. Signals V0, V1, V2, and V3 can be provided with different voltages or with the same voltage at a particular time, depending on which operation memory device 200 operates at that particular time.

As shown in FIGS. 2, drivers 240, 241, 242, and 243 can be coupled to between respective access lines 220, 221, 222, and 223 and respective access lines 220'. Each of drivers 240, 241, 242, and 243 can operate as a switch that can be turned on (e.g., placed in a conductive state (or on-state))) or turned off (e.g., placed in a non-conductive state (or off-state)). Drivers 240, 241, 242, and 243 can be configured to turn on in order to form conductive paths (e.g., current paths) between respective access lines 220, 221, 222, and 223 and 220', 221', 222', and 223'. For example, drivers 240, 241, 242, and 243 can be turned on during read and write operations of memory device 200 when memory cell string 231 or 232 is selected to store information in or read information from a selected memory cell (or memory cells) of memory cell string 231 or 232, Drivers 240, 241, 242, and 243 can be configured to turn off in order to not form conductive paths (e.g., current paths) between respective access lines 220, 221, 222, and 223 and 220', 221', 222', and 223'. For example, drivers 240, 241, 242, and 243 can be turned off when memory cell string 231 or 232 is not selected to store information in or read information from a selected memory cell (or memory cells) in memory cell string 231 or 232.

As shown in FIG. 2, each of drivers 240, 241, 242 and 243 can include control gates (multiple control gates) 251, 252, 253, 254, 255, and 256. Drivers 240, 241, 242, and 243 can share control gates 251 through 256, such that signals (e.g., control signals or voltages) CG1, CG2, CG3, CG4, CG5, and CG6 (shown in FIG. 3) provided to control gates 251 through 256, respectively, can be used to concurrently control (e.g., simultaneously turn on or simultaneously turn off) drivers 240, 241, 242, and 243. FIG. 2 shows an example where each of drivers 240, 241, 242, and 243 can include six control gates (e.g., 251, 252, 253, 254, 255, and 256). However, the number of control gates can vary. For example, each of drivers 240, 241, 242, and 243 can include only two control gates and two associated signals to control the two control gates. In another example, each of drivers 240, 241, 242, and 243 can include three or more control gates and associated control signals.

As shown in FIG. 2, memory device 200 can include gate control circuitry 247 to provide different sets of voltages to control gates 251 through 256. For example, gate control circuitry 247 can provide a set of voltages to respective signals CG1, CG2, CG3, CG4, CG5, and CG6 (shown in FIG. 3) to concurrently turn on drivers 240, 241, 242, and 243, and another set of voltages to signals CG1, CG2, CG3, CG4, CG5, and CG6 to concurrently turn off drivers 240, 241, 242, and 243.

Drivers 240, 241, 242, and 243 can provide (e.g., drive or pass) signals (e.g., voltages) V0, V1, V2, and V3 from respective access lines 220', 221', 222', and 223' to respective access lines 220, 221, 222, and 223 when drivers 240, 241, 242, and 243 are turned on. Drivers 240, 241, 242, and 243 do not provide signals V0, V1, V2, and V3 to respective access lines 220, 221, 222, and 223 when drivers 240, 241, 242, and 243 are turned off.

Memory device 200 can include voltage control circuitry 248 to control the values of voltages provided by signals V0, V1, V2, and V3 to access lines 220, 221, 222, and 223. The values of voltages provided by signals V0, V1, V2, and V3 can be different from each other during an operation (e.g., read or write operation) of memory device 200. As an example, in a read operation of memory device 200, if memory cell 212 of memory cell string 231 is selected to be read (e.g., to sense information from memory cell 212 of memory cell string 231), then the voltage applied to access line 222 (associated with signal WL2) can have one value (e.g., a value equal to a read voltage Vread (e.g., V2=Vread)), and the value of voltages applied to access lines 220, 221, and 223 can be the same (e.g., V0=V1=V3) but can be different the value of voltage Vread (e.g., V2<V0, V2, V3). In another example, in a write (e.g., program operation) of memory device 200, if memory cell 212 of memory cell string 231 is selected to store information, then the voltage applied to access line 222 (associated with signal WL2) can have one value (e.g., a value equal to a program voltage Vprg (e.g., V2=Vprg (e.g., 30V)), and the value of voltages applied to access lines 220, 221, and 223 can be the same (e.g., V0=V1=V3) but can be different from the value of voltage V2 (e.g., V2>V0, V1, V3). Thus, the values of voltages provided by signals V0, V1, V2, and V30 to access lines 220, 221, 222, and 223 (through respective pillars 240p1, 241p1, 242p1, and 243p1) can be different between operations (e.g., between read and write operations) of memory device 200.

During an erase operation of memory device 200 to erase information from memory cell strings 231 and 232, an erase voltage (e.g., Verase of approximately 30V) can be applied to data line 270 and line 299, and access lines o 220, 221, 222, and 223 can be applied with zero volts. During an erase operation of memory device 200 to erase information from other memory cell strings that share data line 270 the erase voltage may also be applied to data line 270 and line 299 however, access lines 220, 221, 222, and 223 can be place in a float condition (or alternatively be applied with some voltages (through pillars 240p1, 241p1, 242p1, and 243p1).

In the physical structures of drivers 240 (as described in more detail with reference to FIG. 3 through FIG. 17, each of pillars 240p1, 241p1, 242p1, and 243p1 can include different portions coupled between a respective local access line (e.g., one of access lines 220, 221, 222, and 223) and a respective global access line (e.g., one of lines 220' through 223'). For example, as shown in FIG. 2, pillar 240p1 can include portions 240d, 240a, 240b, and 240s. Portions 240d, 240a 240b, and 240s can be parts of the drain, a lightly doped portion relative to the drain (e.g., lightly doped drain (LDD) portion), the body (e.g., channel), and the source, respectively, of pillar 240p1. In the physical structures of driver 240, it can include a pillar (e.g., a vertical pillar) 240p1 where portions 240d, 240b, and 240s can be portions of pillar 240p1. In FIG. 2, driver 240 can form a conductive path between access lines 220 and 220' through portions 240d, 240a, 240b, and 240s when driver 240 is turned on. Pillar 240p1 does not form a conductive path between access lines 220 and 220' when driver 240 is turned off.

Each of drivers 241 through 243 can include elements (e.g., a pillar and associated portions) similar to the elements of driver 240. For example, driver 241 can include pillar 241p1 that can include portions 241d, 241a, 241b, and 241s. Driver 242 can include pillar 242p1 that can include portions 242d, 242a, 242b, and 242s. Driver 243 can include pillar 243p1 that can include portions 243d, 243a, 243b, and 243s.

Figure 3:
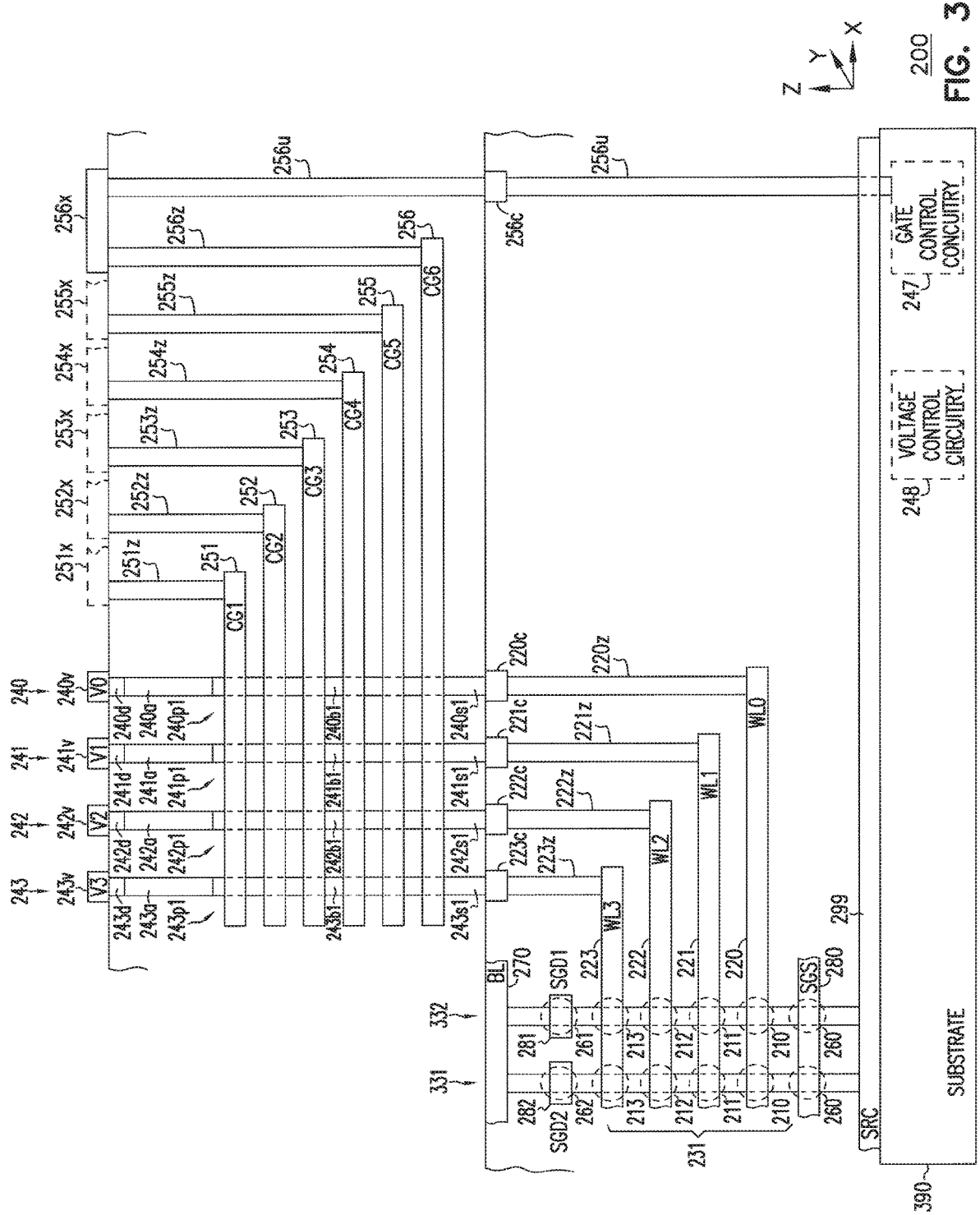
FIG. 3 shows a side view of a structure of a portion of the memory device of FIG. 2, according to some embodiments described herein.

FIG. 3 shows a side view of a structure of a portion of memory device 200, according to some embodiments described herein. The structure of memory device 200 in FIG. 3 corresponds to part of the schematic diagram of memory device 200 shown in FIG. 2. As shown in FIG. 3, memory device 200 can include a substrate 390 over which memory cells 210, 211, 212, and 213 of memory cell strings 231 and 232 can be formed in different levels (internal levels) over substrate 390 (e.g., formed vertically in z-direction with respect to line 299 and substrate 390).

Substrate 390 of memory device 200 can include monocrystalline (also referred to as single-crystal) semiconductor material. For example, substrate 390 can include monocrystalline silicon (also referred to as single-crystal silicon). The monocrystalline semiconductor material of substrate 390 can include impurities, such that substrate 390 can have a specific conductivity type (e.g., n-type or p-type).

Gate control circuitry 47 and voltage control circuitry 248 can be formed in substrate 390. Although not shown in FIG. 3, substrate 390 can include circuitry (that can be located under line 299). Such circuitry can include sense amplifiers, buffers (e.g., page buffers), decoders, and other circuit components of memory device 200.

As shown in FIG. 3, data line 270 can have a length extending in the x-direction, which is perpendicular to the z-direction. Data line 270 can include a conductive material (e.g., conductively doped polycrystalline silicon (doped polysilicon), metals, or other conductive materials). Line 299 can include a conductive material and can have a length extending in the x-direction. FIG. 3 shows an example where line 299 (e.g., source) can be formed over a portion of substrate 390 (e.g., by depositing a conductive material over substrate 390). Alternatively, line 299 can be formed in or formed on a portion of substrate 390 (e.g., by doping a portion of substrate 390). In another alternative structure of memory device 200, line 299 can be form over a dielectric material (e.g., an oxide material over substrate 390.

Select line (e.g., drain select line) 281 and 282 can be located in a level between data line 270 and memory cell strings 231 and 232. Select line (e.g., source select line) 280 can be located in a level between memory cell strings 231 and 232 and line 299 (and substrate 390).

Memory cells 210, 211, 212, and 213 of memory cell strings 231 and 232 can be located in respective levels between the level of select lines 281 and 282 and the level of select line 280. Access lines 220, 221, 222, and 223 (associated with memory cells 210, 211, 212, and 213, respectively) can be located in the same levels as memory cells 210, 211, 212, and 213, respectively.

Access lines 220, 221, 222, and 223 can include conductive materials (a group of conductive materials), which can include conductively doped polysilicon, metals, or other conductive materials. Memory device 200 can include dielectric materials (e.g., not labeled), interleaved with (located in the spaces between) access lines 220, 221, 222, and 223. Examples of such dielectric materials include silicon dioxide. The materials of select lines 280, 281, and 282 can include conductively doped polysilicon, metals, or other conductive materials and can be the same as the conductive material of access lines 220, 221, 222, and 223.

As shown in FIG. 3, memory device 200 can include pillars (memory cell pillars) 331 and 332. Each of pillars 331 and 332 can have length extending in the z-direction (e.g., extending vertically with respect to substrate 390) through access lines 220, 221, 222, and 223 and through the dielectric materials (e.g., silicon dioxide) that are interleaved with access lines 220, 221, 222, and 223. Each of pillars 331 and 332 can contact a conductive region of the material that forms part of data line 270 and contact a conductive region of the material that forms part of line 299.

Each of pillars 331 and 332 can include a material (or materials) to form a conductive path (e.g., a current path) between data line 270 and line 299. Such a material (e.g., undoped or doped polysilicon) of each of pillars 331 and 332 can be part of a channel (not shown in FIG. 3) of a respective pillar among pillars 331 and 332.

For simplicity, FIG. 3 omits detailed structures of memory cells 210, 211, 212, and 213. However, memory cells 210, 211, 212, and 213 can include structures of a 3D NAND memory device or other non-volatile memory devices. For example, memory cells 210, 211, 212, and 213 can include a TANOS (TaN, $Al_2O_3$, $Si_3N_4$, $SiO_2$, Si) structure, a SONOS (Si, $SiO_2$, $Si_3N_4$, $SiO_2$, Si) structure, a floating gate structure, or other memory cell structures.

Each of select gates 260, 261, and 262 can operate as a switch (e.g., a field-effect transistor (FET) structure. Thus, each of select gates 260, 261, and 262 can have a structure of a FET. Alternatively, each of select gates 260, 261, and 262 can have the same structure (e.g., TANOS, SONOS, or floating gate structure) as memory cells 210, 211, 212, and 213.

As shown in FIG. 3, each of select lines 280, 281, and 282 is a piece (e.g., a single layer) of conductive material (e.g., polysilicon, metal, or other conductive materials). A select line (e.g., select line 280, 281, or 282) can carry a signal (e.g., signal SGD1, SDG2, or SGS) but it does not operate like a switch (e.g., a transistor). A select gate (e.g., select gate 260, 261, and 262 can include a portion of a respective select line (e.g., a portion of the piece of the conductive material that forms the respective select line) and additional structures to perform a function (e.g., function of a transistor). For example, each of select gate 260 can include a portion of select line 280 and a portion of a structure (not shown) along pillar 331 adjacent select line 280; select gate 261 can include a portion of select line 281 and a portion of a structure (not shown) along pillar 331 adjacent select line 281; and select gate 262 can include a portion of select line 282 and a portion of a structure (not shown) along pillar 332 adjacent select line 282.

Memory device 200 can include conductive segments 220z, 221z, 222z, and 223z (e.g., vertical segments extending in the z-direction) and contacting respective access lines 220, 221, 222, and 223 and respective conductive contacts 220c, 221c, 222c, and 223c. Pillars 240p1, 241p1, 242p1, and 243p1 of respective drivers 240, 241, 242, and 243 can be coupled to respective access lines 220, 221, 222, and 223 through respective conductive contacts 220c, 221c, 222c, and 223c and respective conductive segments 220z, 221z, 222z, and 223z. In FIG. 3, portions 240b1, 241b1, 242b1, and 243b1 are partial structures of portions 240b, 241b, 242b, and 243b (schematically shown in FIG. 2), respectively. Other parts of the structures of portions 240b, 241b, 242b, and 243b are shown in more details in FIG. 4 through FIG. 5D. Similarly, in FIG. 3, portions 240s1, 241s1, 242s1, and 243s1 are partial structures of portions 240s, 241s, 242s, and 243s (schematically shown in FIG. 2), respectively. Other parts of the structures of portions 240s, 241s, 242s, and 243s are shown in more details in FIG. 4 through FIG. 5D.

As shown in FIG. 3, control gate 251 through 256 of respective drivers 240, 241, 242, and 243 can be located in different levels of memory device 200 over (above) the levels where memory cells 210, 211, 212, and 213 are located. Control gates 251 through 256 can include conductive materials (a group of conductive materials), which can include conductively doped polysilicon (e.g., n-type or p-type polysilicon), metals, or other conductive materials. Memory device 200 can include dielectric materials (e.g., not labeled), interleaved with (located in the spaces between) control gates 251 through 256. Examples of such dielectric materials include silicon dioxide.

Each of pillars 240p1, 241p1, 242p1, and 243p1 can have length extending in the z-direction (e.g., extending vertically with respect to substrate 390) through control gates 251 through 256 and through the dielectric materials (e.g., silicon dioxide) that are interleaved with control gates 251 through 256.

Memory device 200 can include conductive regions 240v, 241v, 242v, and 243v that can be parts of conductive materials (e.g., conductively doped polysilicon, metal, or other conductive materials) that can form parts of respective access lines (e.g., global access lines) 220', 221', 222', and 223'. Although not shown in FIG. 3, memory device 200 can include conductive connections (which can be part of access lines 220', 221', 222', and 223') that can be formed to provide electrical connections between respective pillars 240$p$1, 241$p$1, 242$p$1, and 243$p$1 and voltage control circuitry 248. As described above with reference to FIG. 2, voltage control circuitry 248 (e.g., formed in substrate 390 of FIG. 3) can operate to apply different voltages to access lines 220, 221, 222, and 223 (through respective pillars 240$p$1, 241$p$1, 242$p$1, and 243$p$1 when drivers 240 through 243 are turned on (e.g., concurrently turned on)).

As shown in FIG. 3, each of pillars 240$p$1, 241$p$1, 242$p$1, and 243$p$1 can be located between (and can contact) a respective conductive region among conductive regions 240$v$, 241$v$, 242$v$, and 243$v$ and a respective conductive contact among conductive contacts 220$c$, 221$c$, 222$c$, and 223$c$. For example, as shown in FIG. 3, pillar 240$p$1 can be located between conductive region 240$v$ and conductive contact 220$c$, in which portion 240$d$ contacts (e.g., directly coupled to) conductive region 240$v$, and portion 240$s$1 of pillar 240$p$1 contacts (e.g., directly coupled to) conductive contact 220$c$. Similarly, each of pillars 241$p$1, 242$p$1, and 243$p$1 can have respective portion 240$d$ contacting a respective conductive region (among respective conductive regions 241$v$, 242$v$, and 243$v$) and a respective portion 240$s$1, 241$s$1, 242$s$1, and 243$s$1 contacting a respective conductive contact (among conductive contacts 221$c$, 222$c$, and 223$c$).

Memory device 200 can include connections (conductive connections that can include conductive segments 251$z$ through 256$z$, 251$x$ through 256$x$, and 256$u$) to form conductive paths between control gates 251 through 256 and gate control circuitry 247. For example, memory device 200 can include a conductive connection (between control gate 256 and gate control circuitry 247) that can include conductive segments 256$z$ (e.g., vertical segment in the z-direction), 256$x$ (e.g., horizontal segment in the x-direction, and 256$u$ (e.g., vertical segments in the z-direction). Other connections between control gates 251 through 255 are shown in FIG. 3. Memory device 200 can include conductive segments 251$z$ through 255$z$ (hidden from the view of FIG. 3), which are similar to conductive segment 256$z$, coupled to respective control gates 251 through 255.

FIG. 3 shows example structures (e.g., a staircase structure at edges) of control gates 251 through 256. However, in an alternative structure of memory device 200, control gates 251 through 256 may have other structures as long as conductive connections (e.g., connections similar to connections formed by conductive segments 251$z$ through 256$z$, 251$x$ through 256$x$, and 256$u$) can be formed to provide electrical connections between respective control gates 251 through 256 and gate control circuitry 247. Moreover, FIG. 3 shows an example where control gates 251 through 256 are located above memory cells 210, 211, 212, and 213 (and above access lines 220, 221, 222, and 223). However, control gates 251 through 256 can be located below memory cells 210, 211, 212, and 213. Further, FIG. 3 shows an example where pillars 240$p$1, 241$p$1, 242$p$1, and 243$p$1 of drivers 240 through 243 are vertically located (e.g., having a length in the z-direction) above memory cells 210, 211, 212, and 213. In an alternative structure of memory device 200, pillars 240$p$1, 241$p$1, 242$p$1, and 243$p$1 can be horizontally located (e.g., having a length in the x-direction or y-direction) in memory device 200.

Figure 4:
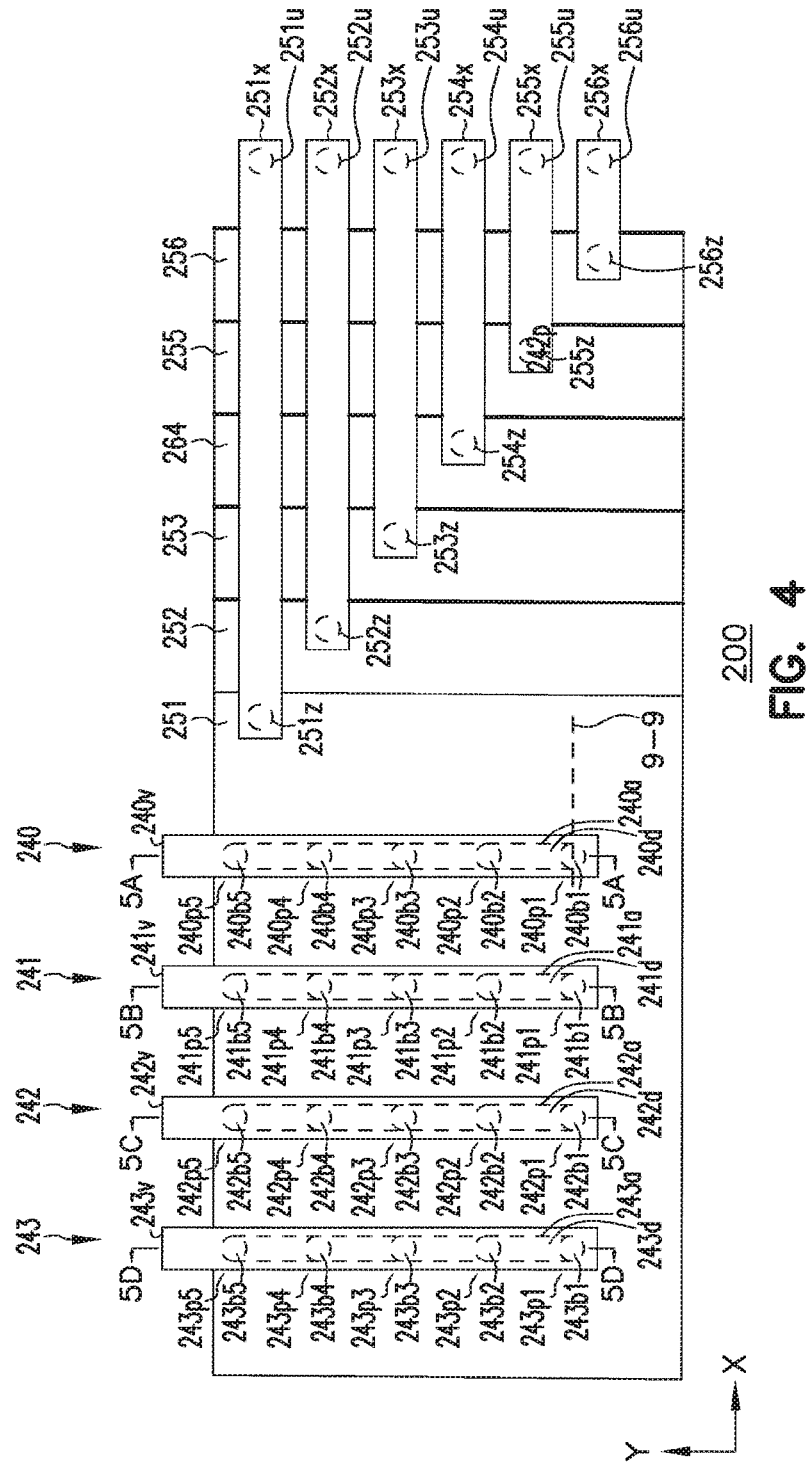
FIG. 4 shows a top view of a structure of the portion of the memory device of FIG. 3, according to some embodiments described herein.

FIG. 4 shows a top view of a structure of the portion of memory device 200 including the portion shown in FIG. 3, according to some embodiments described herein. FIG. 4 shows example structures and routing paths of connections (e.g., connections including conductive segments 251$z$ through 256$z$, 251$x$ through 256$x$, and 251$z$ through 256$u$) associated with drivers 240, 241, 242, and 243. However, in an alternative structure of memory device 200, the structures and routing paths of connections associated with drivers 240, 241, 242, and 243 can be different from those shown in FIG. 3 and FIG. 4.

In FIGS. 4, lines 5A-5A, 5B-5B, 5C-5C, and 5D-5D can represent cross-sectional lines where different side views (e.g., cross-sectional views) of memory device 200 are shown in FIG. 5A, FIG. 5B, FIG. 5C, and FIG. 5D, respectively. Line 9-9 in FIG. 4 can represent a cross-sectional line where a portion of driver 240 is shown in FIG. 9 (described below after the description of FIG. 8D).

As shown in FIG. 4, conductive regions 240$v$, 241$v$, 242$v$, and 243$v$ can be parts of respective conductive materials (e.g., conductive lines) that can extend in the y-direction. Conductive segments 251$z$ through 256$z$ (coupled to respective control gates 251 through 256) can be arranged in the x-direction and y-direction as shown in FIG. 4. Conductive segment 251$x$ through 256$x$ can be part of respective conductive materials that can extend in the x-direction, which is perpendicular to the y-direction. Conductive segments 251$u$ through 256$u$ (underneath respective conductive segments 251$z$ through 256$z$) can be spaced apart in the y-direction.

As shown in FIG. 4, driver 240 can include pillars 240$p$2, 240$p$3, 240$p$4, and 240$p$5 (which are not shown in the view of FIG. 3) in addition to pillar 240$p$1 (shown in FIG. 3). Pillars 240$p$2, 240$p$3, 240$p$4, and 240$p$5 can include associated pillar portions 240$b$2, 240$b$3, 240$b$4, and 240$b$5. Pillars 240$p$2, 240$p$3, 240$p$4, and 240$p$5 and can be arranged in the same row with pillar 240$p$1. Pillars 240$p$1, 240$p$2, 240$p$3, 240$p$4, and 240$p$5 can be formed underneath conductive region 240$v$ (and underneath portion 240$d$) in the y-direction. As shown in FIG. 4, pillars 240$p$1, 240$p$2, 240$p$3, 240$p$4, and 240$p$5 can share portion 240$d$ (e.g., part of a drain) and portion 240$a$ (e.g., LDD structure). Thus, parts of respective pillars 240$p$1, 240$p$2, 240$p$3, 240$p$4, and 240$p$5 can contact each other (e.g., can be electrically coupled to other) through portion 240$a$ and through portion 240$d$.

Driver 241 can include pillars 241$p$1, 241$p$2, 241$p$3, 241$p$4, and 241$p$5 (which are not shown in the view of FIG. 3) in addition to pillar 241$p$1 (shown in FIG. 3). Pillars 241$p$2, 241$p$3, 241$p$4, and 241$p$5 can include associated pillar portions 241$b$2, 241$b$3, 241$b$4, and 241$b$5. Pillars 241$p$2, 241$p$3, 241$p$4, and 241$p$5 and can be arranged in the same row with pillar 241$p$1. Pillars 241$p$1, 241$p$2, 241$p$3, 241$p$4, and 241$p$5 can be formed underneath conductive region 241$v$ (and underneath portion 241$d$) in the y-direction. As shown in FIG. 4, pillars 241$p$1, 241$p$2, 241$p$3, 241$p$4, and 241$p$5 can share portion 241$d$ (e.g., part of a drain) and portion 241$a$ (e.g., LDD structure). Thus, parts of respective pillars 241$p$1, 241$p$2, 241$p$3, 241$p$4, and 241$p$5 can contact each other (e.g., can be electrically coupled to other) through portion 241$a$ and through portion 241$d$.

Driver 242 can include pillars 242$p$1, 242$p$2, 242$p$3, 242$p$4, and 242$p$5 (which are not shown in the view of FIG. 3) in addition to pillar 242$p$1 (shown in FIG. 3). Pillars 242$p$2, 242$p$3, 242$p$4, and 242$p$5 can include associated pillar portions 242$b$2, 242$b$3, 242$b$4, and 242$b$5. Pillars 242$p$2, 242$p$3, 242$p$4, and 242$p$5 and can be arranged in the same row with pillar 242$p$1. Pillars 242$p$1, 242$p$2, 242$p$3, 242p4, and 242p5 can be formed underneath conductive region 242v (and underneath portion 242d) in the y-direction. As shown in FIG. 4, pillars 242p1, 242p2, 242p3, 242p4, and 242p5 can share portion 242d (e.g., part of a drain) and portion 242a (e.g., LDD structure). Thus, parts of respective pillars 242p1, 242p2, 242p3, 242p4, and 242p5 can contact each other (e.g., can be electrically coupled to other) through portion 242a and through portion 242d.

Driver 243 can include pillars 243p1, 243p2, 243p3, 243p4, and 243p5 (which are not shown in the view of FIG. 3) in addition to pillar 243p1 (shown in FIG. 3). Pillars 243p2, 243p3, 243p4, and 243p5 can include associated pillar portions 243b2, 243b3, 243b4, and 243b5. Pillars 243p2, 243p3, 243p4, and 243p5 and can be arranged in the same row with pillar 243p1. Pillars 243p1, 243p2, 243p3, 243p4, and 243p5 can be formed underneath conductive region 243v (and underneath portion 243d) in the y-direction. As shown in FIG. 4, pillars 243p1, 243p2, 243p3, 243p4, and 243p5 can share portion 243d (e.g., part of a drain) and portion 243a (e.g., LDD structure). Thus, parts of respective pillars 243p1, 243p2, 243p3, 243p4, and 243p5 can contact each other (e.g., can be electrically coupled to other) through portion 243a and through portion 243d.

As shown in FIG. 4, the pillars of one driver (e.g., pillars 240p1, 240p2, 240p3, 240p4, and 240p5 of driver 240) and associated pillar portions (e.g., 240a and 240d) of the pillar are separated from the pillars (and associated pillar portions) of other drivers (e.g., pillars 241p1, 241p2, 241p3, 241p4, an 241p5 of driver 241) in the x-direction. Thus, as described above, the pillars of the same driver can share an LDD structure. However, pillars of different drivers have different LDD structures. Thus, an LDD structure of one driver (e.g., portion 240a of driver 240) is electrically separated from an LDD structure (e.g., portion 241a of driver 241).

In FIG. 4, lines 5A-5A, 5B-5B, 5C-5C, and 5D-5D can represent cross-sectional lines where different side views (e.g., cross-sectional views) of memory device 200 are shown in FIG. 5A, FIG. 5B, FIG. 5C, and FIG. 5D, respectively.

Figure 5A:
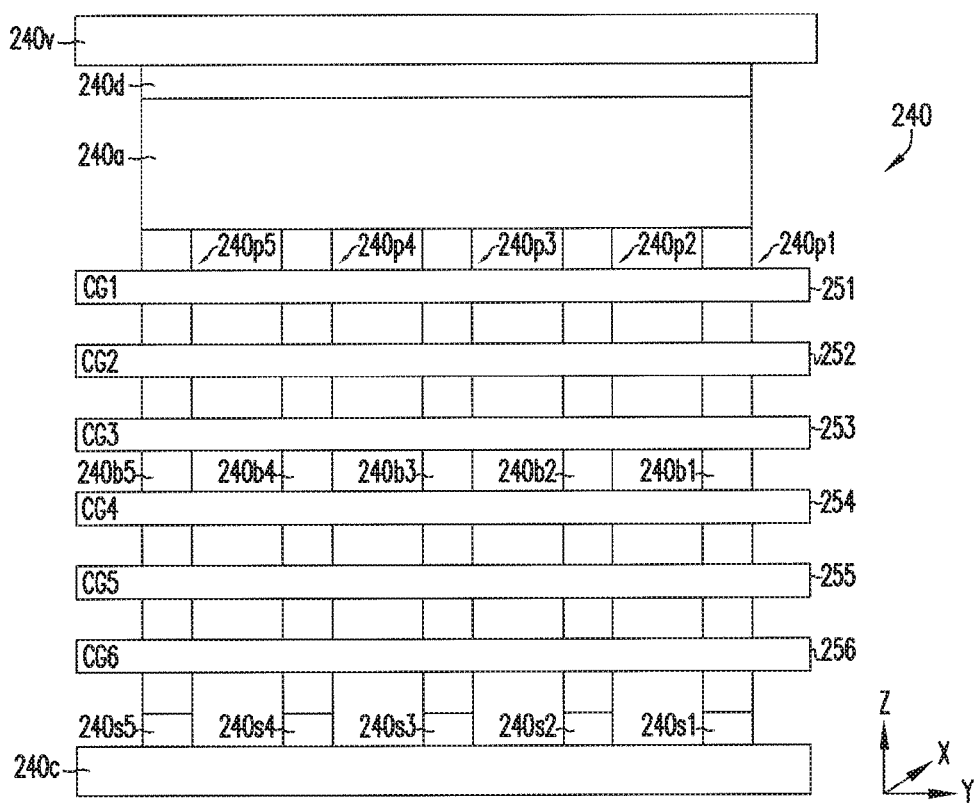
FIG. 5A, FIG. 5B, FIG. 5C, and FIG. 5D show structures of drivers of the memory device of FIG. 4 along different cross-sectional lines shown in FIG. 4, according to some embodiments described herein.

FIG. 5A shows a structure of a portion of memory device 200 of FIG. 4 including part of the structure of driver 240 along lines 5A-5A of FIG. 4, according to some embodiments described herein. As shown in FIG. 5A, each of pillars 240p1, 240p2, 240p3, 240p4, and 240p5 can have length extending in the z-direction between conductive region 240v and conductive contact 220c. As described above with reference to FIG. 2, FIG. 3, and FIG. 4, conductive region 240v can be coupled to (e.g., part of) a global access line (e.g., access line 220' in FIG. 2. Conductive contact 220c can be coupled to (e.g., part of) a local access line (e.g., access line 220 in FIG. 2). As shown in FIG. 5A, conductive region 240v can extend (e.g., has a length) continuously in the y-direction. Conductive contact 220c can extend (e.g., has a length) continuously in the y-direction.

Each of pillars 240p1, 240p2, 240p3, 240p4, and 240p5 of driver 240 can extend through control gates 251 through 256 and through the dielectric materials (e.g., silicon dioxide) that are interleaved with control gates 251 through 256. Driver 240 can also include portions (e.g., sources) 240s2, 240s3, 240s4, and 240s5 (which are not shown in the views of FIG. 3 and FIG. 4) in addition to portion 240s1 (shown in FIG. 3). Portions 240s1, 240s2, 240s3, 240s4, and 240s5 are separated from each other and can be arranged in a row in the y-direction. Portions 240s1, 240s2, 240s3, 240s4, and 240s5 are collectively shown in FIG. 2 as portion 240s.

As shown in FIG. 5A, portion 240d can be a piece (e.g., a single piece) of material (e.g., conductively doped polysilicon). Portion 240d can extend (e.g., has a length) continuously in the y-direction among pillars 240p1, 240p2, 240p3, 240p4, and 240p5 (e.g., from pillar 240p1 to pillar 240p5) and contacts (e.g., directly contacts) conductive region 240v.

Portion 240a (e.g., shared (or merged) LDD portion) can be a piece (e.g., a single piece) of material (e.g., a single piece of polycrystalline material (e.g., conductively doped polysilicon)). Portion 240a can extend (e.g., has a length) continuously in the y-direction among pillars 240p1, 240p2, 240p3, 240p4, and 240p5 (e.g., from pillar 240p1 to pillar 240p5) and contacts (e.g., directly contacts) portion 240d. As shown in FIG. 5A, pillars 240p1, 240p2, 240p3, 240p4, and 240p5 can share portion 240a, such that each of pillars 240p1, 240p2, 240p3, 240p4, and 240p5 can have a portion which is part of the piece of material of portion 240a, and respective parts (e.g., portions 240b1, 240b2, 240b3, 240b4, and 240b5) of pillars 240p1, 240p2, 240p3, 240p4, and 240p5 can contact (e.g., electrically couple to) portion 240a.

Figure 5B:
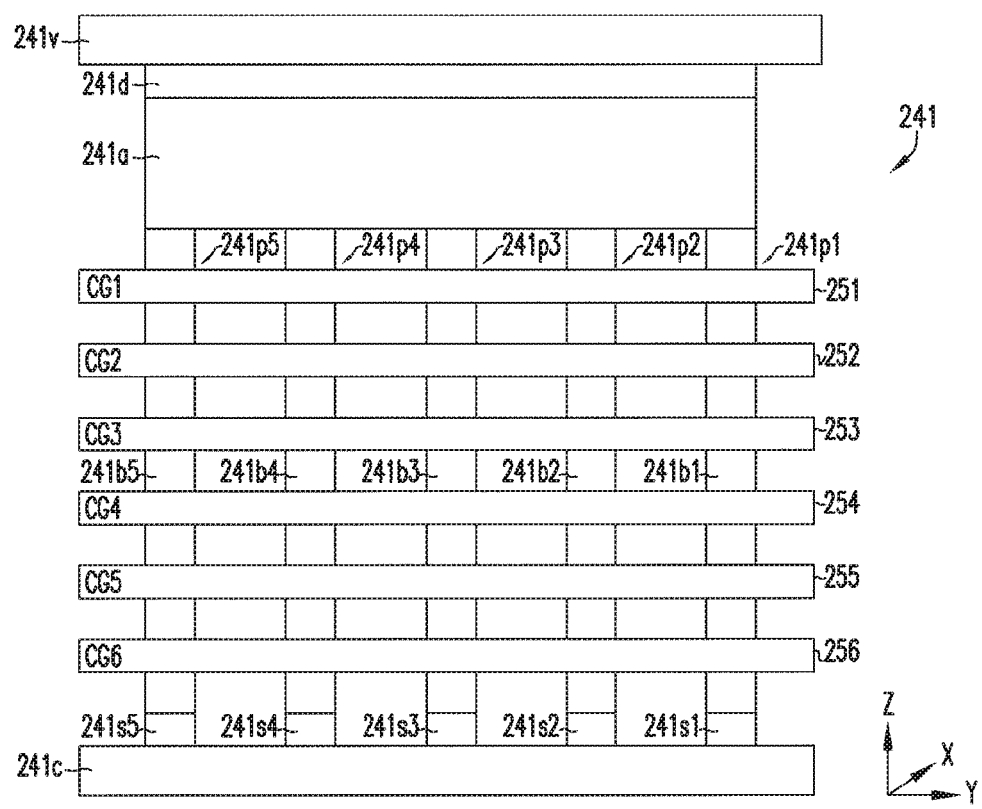

FIG. 5B shows a structure of a portion of memory device 200 of FIG. 4 including part of the structure of driver 241 along lines 5B-5B of FIG. 4, according to some embodiments described herein. The structure of driver 241 (FIG. 5B) can be similar to the structure of driver 240 shown in FIG. 5A. As shown in FIG. 5B, each of pillars 241p1, 241p2, 241p3, 241p4, and 241p5 can have length extending in the z-direction between conductive region 241v and conductive contact 221c. As describe above with reference to FIG. 2, FIG. 3, and FIG. 4, conductive region 241v can be coupled to (e.g., part of) a global access line (e.g., access line 220' in FIG. 2. Conductive region 241v can extend (e.g., has a length) continuously in the y-direction. Conductive contact 221c can be coupled to (e.g., part of) a local access line (e.g., access line 220 in FIG. 2). Conductive contact 221c can extend (e.g., has a length) continuously in the y-direction.

As shown in FIG. 5B, each of pillars 241p1, 241p2, 241p3, 241p4, and 241p5 of driver 241 can extend through control gates 251 through 256 and through the dielectric materials (e.g., silicon dioxide) that are interleaved with control gates 251 through 256. Driver 241 can also include portions (e.g., sources) 241s2, 241s3, 241s4, and 241s5 (which are not shown in the views of FIG. 3 and FIG. 4) in addition to portion 241s1 (shown in FIG. 3). Portions 241s1, 241s2, 241s3, 241s4, and 241s5 are separated from each other and can be arranged in a row in the y-direction. Portions 241s1, 241s2, 241s3, 241s4, and 241s5 are collectively shown in FIG. 2 as portion 241s.

As shown in FIG. 5B, portion 241d can be a piece (e.g., a single piece) of material (e.g., conductively doped polysilicon). Portion 241d can extend (e.g., has a length) continuously in the y-direction among pillars 240p1, 240p2, 240p3, 240p4, and 240p5 (e.g., from pillar 240p1 to pillar 240p5) and contacts (e.g., directly contacts) conductive region 241v.

Portion 241a (e.g., shared (or merged) LDD portion) can be a piece (e.g., a single piece) of material (e.g., a single piece of polycrystalline material (e.g., conductively doped polysilicon)). Portion 241a can extend (e.g., has a length) continuously in the y-direction among pillars 241p1, 241p2, 241p3, 241p4, and 241p5 (e.g., from pillar 241p1 to pillar 241p5) and contacts (e.g., directly contacts) portion 241d. As shown in FIG. 5B, pillars 241p1, 241p2, 241p3, 241p4, and 241p5 can share portion 241a, such that each of pillars 241p1, 241p2, 241p3, 241p4, and 241p5 can have a portion which is part of the piece of material of portion 241a, and respective parts (e.g., portions 241b1, 241b2, 241b3, 241b4, and 241*b*5) of pillars 241*p*1, 241*p*2, 241*p*3, 241*p*4, and 241*p*5 can contact (e.g., electrically couple to) portion 241*a*.

Figure 5C:
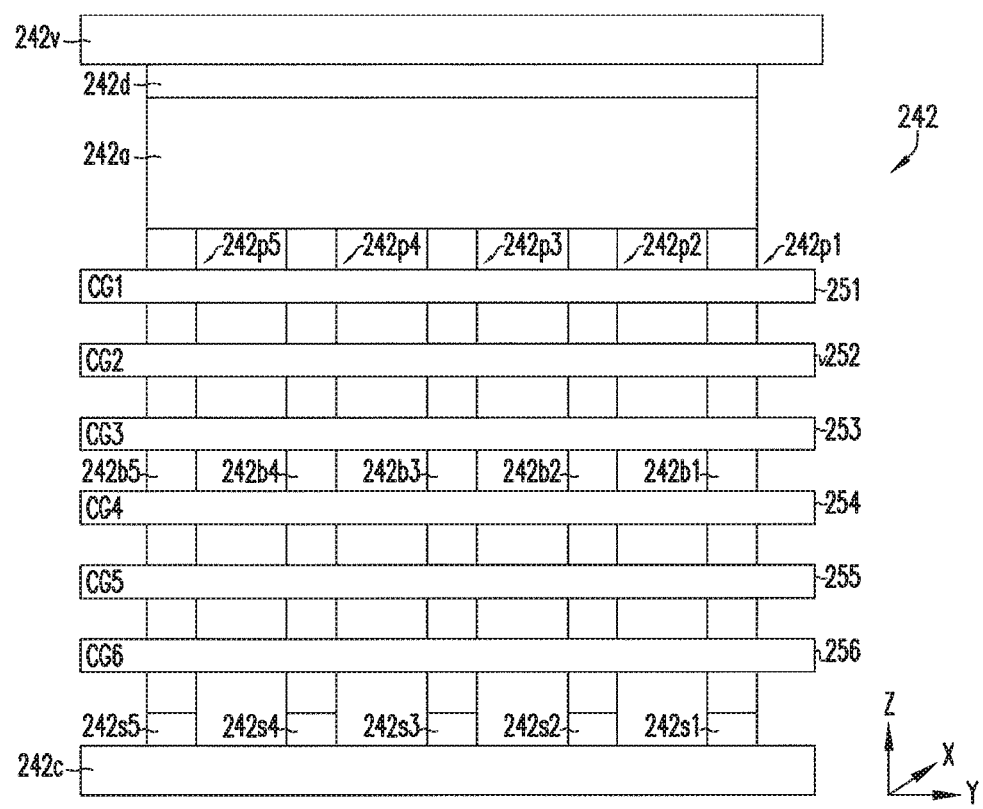

FIG. 5C shows a structure of a portion of memory device 200 of FIG. 4 including part of the structure of driver 242 along lines 5C-5C of FIG. 4, according to some embodiments described herein. The structure of driver 242 (FIG. 5C) can be similar to the structure of driver 242 shown in FIG. 5A. As shown in FIG. 5C, each of pillars 242*p*1, 242*p*2, 242*p*3, 242*p*4, and 242*p*5 can have length extending in the z-direction between conductive region 242*v* and conductive contact 222*c*. As describe above with reference to FIG. 2, FIG. 3, and FIG. 4, conductive region 242*v* can be coupled to (e.g., part of) a global access line (e.g., access line 220' in FIG. 2. Conductive region 242*v* can extend (e.g., has a length) continuously in the y-direction. Conductive contact 222*c* can be coupled to (e.g., part of) a local access line (e.g., access line 220 in FIG. 2). Conductive contact 222*c* can extend (e.g., has a length) continuously in the y-direction.

As shown in FIG. 5C, each of pillars 242*p*1, 242*p*2, 242*p*3, 242*p*4, and 242*p*5 of driver 242 can extend through control gates 251 through 256 and through the dielectric materials (e.g., silicon dioxide) that are interleaved with control gates 251 through 256. Driver 242 can also include portions (e.g., sources) 242*s*2, 242*s*3, 242*s*4, and 242*s*5 (which are not shown in the views of FIG. 3 and FIG. 4) in addition to portion 242*s*1 (shown in FIG. 3). Portions 242*s*1, 242*s*2, 242*s*3, 242*s*4, and 242*s*5 are separated from each other and can be arranged in a row in the y-direction. Portions 242*s*1, 242*s*2, 242*s*3, 242*s*4, and 242*s*5 are collectively shown in FIG. 2 as portion 242*s*.

As shown in FIG. 5C, portion 242*d* can be a piece (e.g., a single piece) of material (e.g., conductively doped polysilicon). Portion 242*d* can extend (e.g., has a length) continuously in the y-direction among pillars 240*p*1, 240*p*2, 240*p*3, 240*p*4, and 240*p*5 (e.g., from pillar 240*p*1 to pillar 240*p*5) and contacts (e.g., directly contacts) conductive region 242*v*.

Portion 242*a* (e.g., shared (or merged) LDD portion) can be a piece (e.g., a single piece) of material (e.g., a single piece of polycrystalline material (e.g., conductively doped polysilicon)). Portion 242*a* can extend (e.g., has a length) continuously in the y-direction among pillars 242*p*1, 242*p*2, 242*p*3, 242*p*4, and 242*p*5 (e.g., from pillar 242*p*1 to pillar 242*p*5) and contacts (e.g., directly contacts) portion 242*d*. As shown in FIG. 5C, pillars 242*p*1, 242*p*2, 242*p*3, 242*p*4, and 242*p*5 can share portion 242*a*, such that each of pillars 242*p*1, 242*p*2, 242*p*3, 242*p*4, and 242*p*5 can have a portion which is part of the piece of material of portion 242*a*, and respective parts (e.g., portions 242*b*1, 242*b*2, 242*b*3, 242*b*4, and 242*b*5) of pillars 242*p*1, 242*p*2, 242*p*3, 242*p*4, and 2445 can contact (e.g., electrically couple to) portion 242*a*.

Figure 5D:
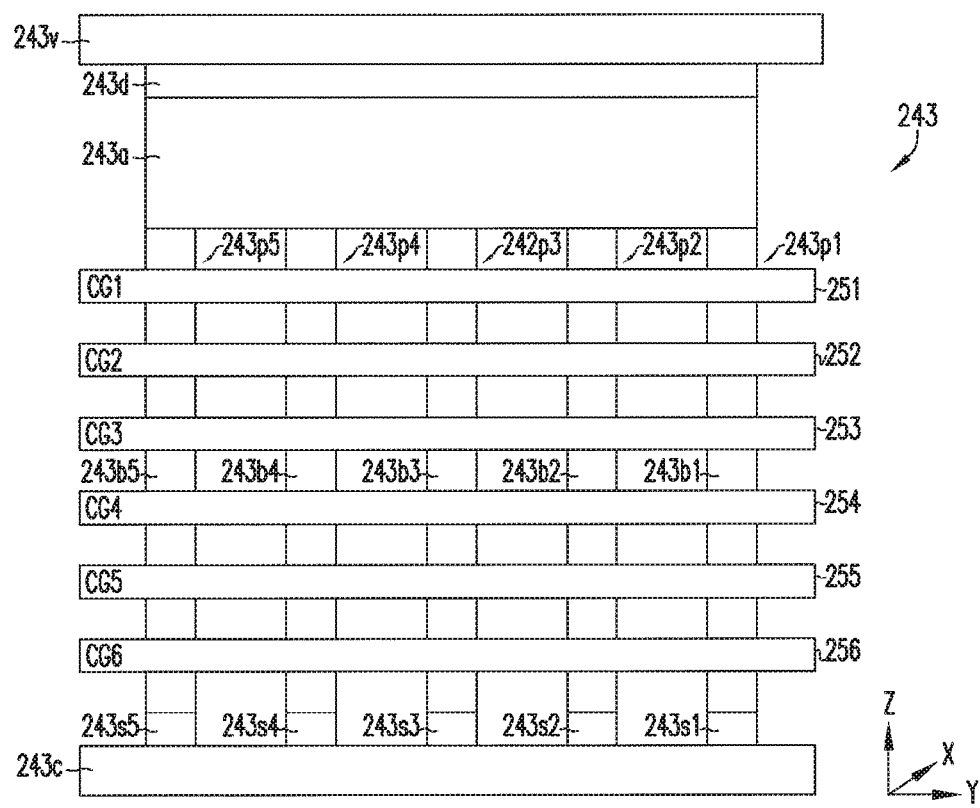

FIG. 5D shows a structure of a portion of memory device 200 of FIG. 4 including part of the structure of driver 243 along lines 5D-5D of FIG. 4, according to some embodiments described herein. The structure of driver 243 (FIG. 5D) can be similar to the structure of driver 243 shown in FIG. 5A. As shown in FIG. 5D, each of pillars 243*p*1, 243*p*2, 243*p*3, 243*p*4, and 243*p*5 can have length extending in the z-direction between conductive region 243*v* and conductive contact 223*c*. As describe above with reference to FIG. 2, FIG. 3, and FIG. 4, conductive region 243*v* can be coupled to (e.g., part of) a global access line (e.g., access line 220' in FIG. 2. Conductive region 243*v* can extend (e.g., has a length) continuously in the y-direction. Conductive contact 223*c* can be coupled to (e.g., part of) a local access line (e.g., access line 220 in FIG. 2). Conductive contact 223*c* can extend (e.g., has a length) continuously in the y-direction.

As shown in FIG. 5D, each of pillars 243*p*1, 243*p*2, 243*p*3, 243*p*4, and 243*p*5 of driver 243 can extend through control gates 251 through 256 and through the dielectric materials (e.g., silicon dioxide) that are interleaved with control gates 251 through 256. Driver 243 can also include portions (e.g., sources) 243*s*2, 243*s*3, 243*s*4, and 243*s*5 (which are not shown in the views of FIG. 3 and FIG. 4) in addition to portion 243*s*1 (shown in FIG. 3). Portions 243*s*1, 243*s*2, 243*s*3, 243*s*4, and 243*s*5 are separated from each other and can be arranged in a row in the y-direction. Portions 243*s*1, 243*s*2, 243*s*3, 243*s*4, and 243*s*5 are collectively shown in FIG. 2 as portion 243*s*.

As shown in FIG. 5D, portion 243*d* can be a piece (e.g., a single piece) of material (e.g., conductively doped polysilicon). Portion 243*d* can extend (e.g., has a length) continuously in the y-direction among pillars 240*p*1, 240*p*2, 240*p*3, 240*p*4, and 240*p*5 (e.g., from pillar 240*p*1 to pillar 240*p*5) and contacts (e.g., directly contacts) conductive region 243*v*.

Portion 243*a* (e.g., shared (or merged) LDD portion) can be a piece (e.g., a single piece) of material (e.g., a single piece of polycrystalline material (e.g., conductively doped polysilicon)). Portion 243*a* can extend (e.g., has a length) continuously in the y-direction among pillars 243*p*1, 243*p*2, 243*p*3, 243*p*4, and 243*p*5 (e.g., from pillar 243*p*1 to pillar 243*p*5) and contacts (e.g., directly contacts) portion 243*d*. As shown in FIG. 5D, pillars 243*p*1, 243*p*2, 243*p*3, 243*p*4, and 243*p*5 can share portion 243*a*, such that each of pillars 243*p*1, 243*p*2, 243*p*3, 243*p*4, and 243*p*5 can have a portion which is part of the piece of material of portion 243*a*, and respective parts (e.g., portions 243*b*1, 243*b*2, 243*b*3, 243*b*4, and 243*b*5) of pillars 243*p*1, 243*p*2, 243*p*3, 243*p*4, and 243*p*5 can contact (e.g., electrically couple to) portion 243*a*.

In comparison with some conventional structures, forming portion 240*a* that is shared among the pillars of the same driver (e.g., driver 240 in FIG. 5A) can have improvements and benefits in comparison with some conventional similar drivers. For example, since portion 240*a* can be relatively large, it can have a relatively large grain size. This can improve on/off current properties (e.g., increase current mobility) and reduce current leakage of the driver (e.g., driver 240) of memory device 200. Further, a relatively larger size of portion 240*a* can reduce resistance (e.g., LDD resistance) that flows through portion 240*a* of driver 240.

The description above of memory device 200 (e.g., FIG. 4) shows an example where a single row of a driver (e.g., driver 240) can share the same LDD structure (e.g., portion 240*a* in FIG. 4). However, a driver (e.g., driver 240) can include multiple rows that share the same LDD structure.

Figure 6:
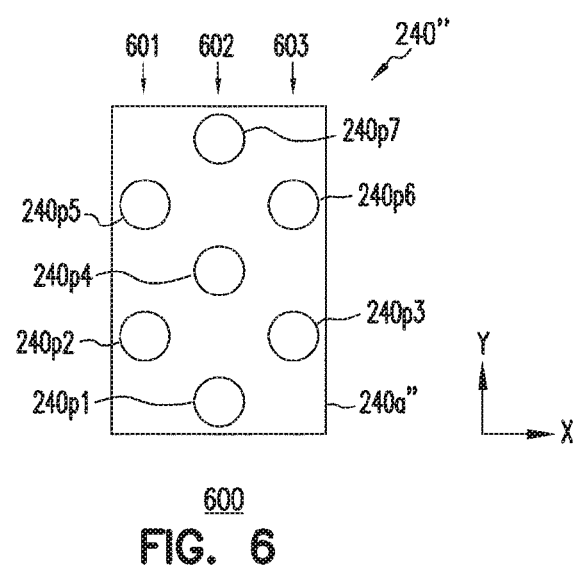
FIG. 6 shows a top view of memory device including a driver having multiple rows of pillars that share a lightly doped structure, according to some embodiments described herein.

FIG. 6 shows a top view of memory device 600 including a driver 240" having multiple rows of pillars 240*p*1, 240*p*2, 240*p*3, 240*p*4, 240*p*5, 240*p*6, and 240*p*7 that share an LDD structure, according to some embodiments described herein. Memory device 600 can be variation of memory device 200 (e.g., FIG. 4) such that pillars 240*p*1, 240*p*2, 240*p*3, 240*p*4, and 240*p*5 can be similar to (or the same as) those of memory device 200. Memory device 600 can include other elements similar to (or the same as) those of memory device 200 that are not shown in FIG. 6 for simplicity. Differences between memory devices 200 and 600 include the structure of driver 240" in FIG. 6. As shown in FIG. 4, each of drivers 240, 241, 242, and 243 of memory device 200 can include a single row of pillars sharing an LDD structure. For example, in FIG. 4, pillars 240*p*1, 240*p*2, 240*p*3, 240*p*4, and 240*p*5 of driver 240 can share portion 240*a*. In FIG. 6, driver 240" of memory device 600 can include multiple rows (e.g., rows 601, 602, and 603) of pillars 240*p*1, 240*p*2, 240*p*3, 240p4, 240p5, 240p6, and 240p7 that can share portion 240a" (e.g., LDD structure). Memory device 600 can also include other drivers (e.g., drivers 241", 242", 243", and 244", not shown in FIG. 6) similar to driver 240". Each of other drivers of memory device 600 can also include multiple rows of pillars that can share an LDD structure.

Figure 7:
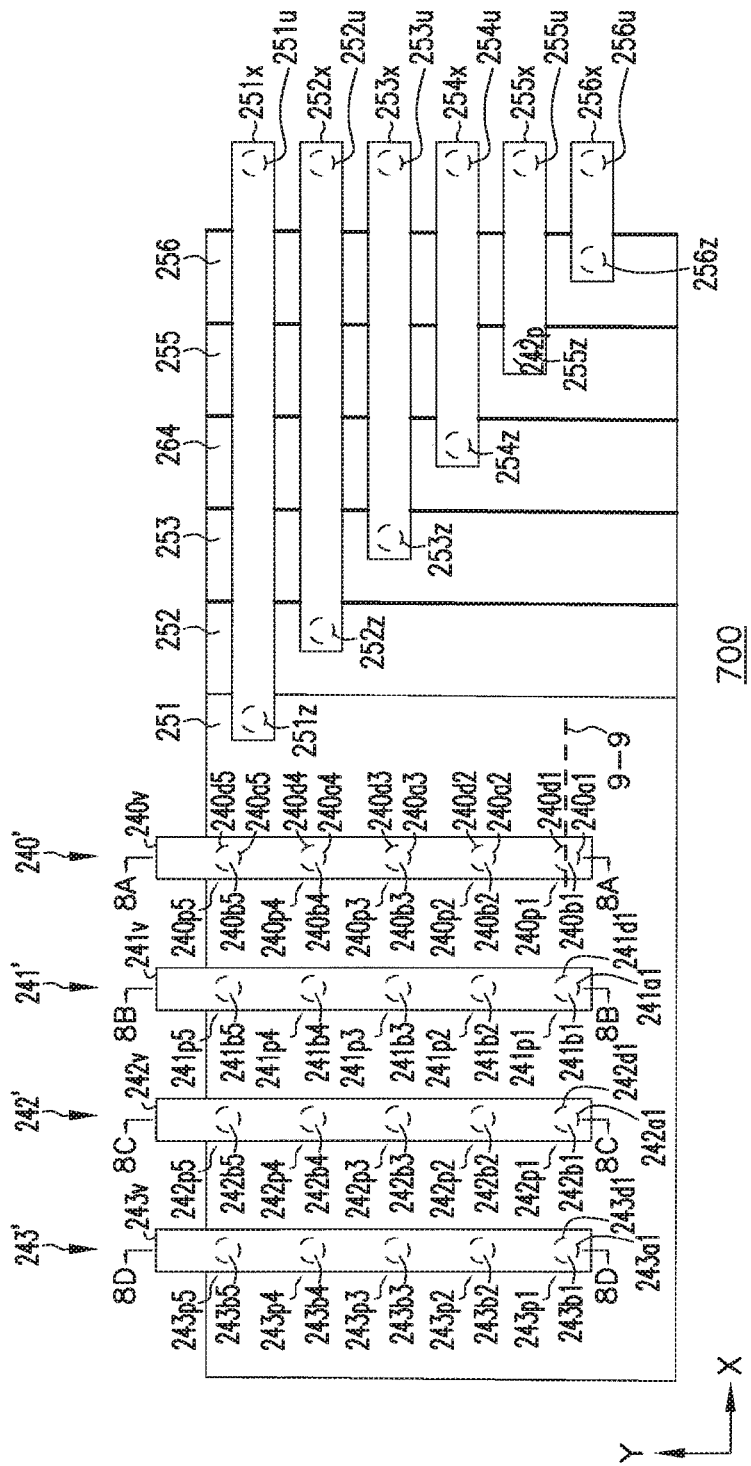
FIG. 7 shows a top view of a structure of the portion of a memory device having separate lightly doped structures, according to some embodiments described herein.

FIG. 7 shows a top view of a structure of the portion of memory device 700, which can be a variation of memory device 200 of FIG. 2 through FIG. 5D, according to some embodiments described herein. Some of the elements of memory device 700 can be similar to (or alternatively the same as) some of the elements of memory device 200 shown in FIG. 2, FIG. 3, and FIG. 4. For example, a schematic diagram of memory device 700 can be the same as the schematic diagram of memory device 200 shown in FIG. 2. A side view of memory device 700 can have a structure similar to the side view of memory device 200 shown in FIG. 3. Thus, for simplicity, similar (or identical) elements between memory devices 200 and 700 are given the same reference labels, and the description herein omits detailed description of the elements of memory device 700.

As shown in FIG. 7, memory device 700 can include drivers 240', 241', 242', and 243' that can include elements similar to those of drivers 240, 241, 242, and 243, respectively, of memory device 200 of FIG. 4. Differences between memory device 700 (FIG. 7) and memory device 200 (FIG. 4) include the omission of some of the elements of drivers 240, 241, 242, and 243 of memory device 700, including the omission of portions 240d and 240a of driver 240, the omission of portions 241d and 241a of driver 241, the omission of portions 242d and 242a of driver 242, and the omission of portions 243d and 243a.

However, as shown in FIG. 7, memory device 700 includes portions (e.g., LDD structures) 240a1, 240a2, 240a3, 240a4, and 240a5 (of driver 240') that can be separated from each other and are formed over respective portions 240b1, 240b2, 240b3, 240b4, and 240b5 (of driver 240') of corresponding pillars 240p1, 240p2, 240p3, 240p4, and 240p5. Memory device 700 also includes portions 240d1, 240d2, 240d3, 240d4, and 240d5 that can be separated from each other and are formed over portions 240a1, 240a2, 240a3, 240a4, and 240a5, respectively.

Memory device 700 includes portions (e.g., LDD structures) 241a1, 241a2, 241a3, 241a4, and 241a5 (portions 241a2, 241a3, 241a4, and 241a5 of driver 241' are not labeled in FIG. 7) that can be separated from each other and are formed over respective portions 241b1, 241b2, 241b3, 241b4, and 241b5 (portions 241b2, 241b3, 241b4, and 241b5 of driver 241' are not labeled in FIG. 7) of corresponding pillars 241p1, 241p2, 241p3, 241p4, and 241p5. Memory device 700 also includes portions 241d1, 241d2, 241d3, 241d4, and 241d5 that can be separated from each other and are formed over portions 241a1, 241a2, 241a3, 241a4, and 241a5, respectively.

Memory device 700 includes portions (e.g., LDD structures) 242a1, 242a2, 242a3, 242a4, and 242a5 (portions 242a2, 242a3, 242a4, and 242a5 of driver 242' are not labeled in FIG. 7) that can be separated from each other and are formed over respective portions 242b1, 242b2, 422b3, 242b4, and 242b5 (portions 242b2, 242b3, 242b4, and 242b5 of driver 242' are not labeled in FIG. 7) of corresponding pillars 242p1, 242p2, 242p3, 242p4, and 242p5. Memory device 700 also includes portions 242d1, 242d2, 242d3, 242d4, and 242d5 that can be separated from each other and are formed over portions 242a1, 242a2, 242a3, 242a4, and 242a5, respectively.

Memory device 700 includes portions (e.g., LDD structures) 243a1, 243a2, 243a3, 243a4, and 243a5 (portions 243a2, 243a3, 243a4, and 243a5 of driver 243' are not labeled in FIG. 7) that can be separated from each other and are formed over respective portions 243b1, 243b2, 243b3, 243b4, and 243b5 (portions 243b2, 243b3, 243b4, and 243b5 of driver 243' are not labeled in FIG. 7) of corresponding pillars 243p1, 243p2, 243p3, 243p4, and 243p5. Memory device 700 also includes portions 243d1, 243d2, 243d3, 243d4, and 243d5 that can be separated from each other and are formed over portions 243a1, 243a2, 243a3, 243a4, and 243a5, respectively.

In FIG. 7, lines 8A-8A, 8B-8B, 8C-8C, and 8D-8D can represent cross-sectional lines where different side views (e.g., cross-sectional views) of memory device 200 are shown in FIG. 8A, FIG. 8B, FIG. 8C, and FIG. 8D, respectively. Line 9-9 (which is also shown in FIG. 4) can represent a cross-sectional line where a portion of driver 240' is shown in FIG. 9 (described below after the description of FIG. 8D).

Figure 8A:
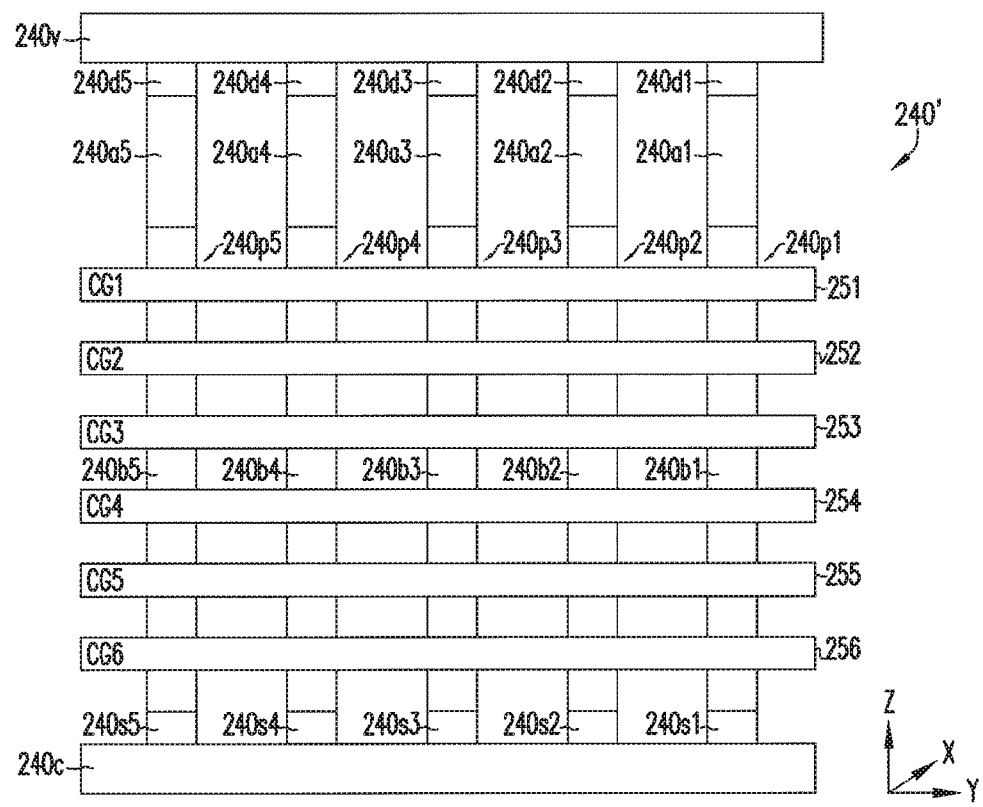
FIG. 8A, FIG. 8B FIG. 8C, and FIG. 8D show structures of drivers of the memory device of FIG. 7 along different cross-sectional lines shown in FIG. 7, according to some embodiments described herein.

FIG. 8A shows a structure of a portion of memory device 700 of FIG. 7 including part of the structure of driver 240' along lines 8A-8A of FIG. 7, according to some embodiments described herein. As shown in FIG. 8A, portions (e.g., LDD structures) 240a1, 240a2, 240a3, 240a4, and 240a5 can be separated from each other (e.g., are not directly coupled to each other) and are formed over portions 240b1, 240b2, 240b3, 240b4, and 240b5, respectively. The separation of the structure of portions 240a1, 240a2, 240a3, 240a4, and 240a5 is different from the continuous structure (e.g., shared (or merged) structure) of portion 240a (e.g., LDD structure) of driver 240 in FIG. 5A. As shown in FIG. 8A, portions 240d1, 240d2, 240d3, 240d4, and 240d5 can be separated from each other and are formed over portions 240a1, 240a2, 240a3, 240a4, and 240a5, respectively. Conductive region 241v (e.g., part of a global access line) can be coupled to each of portions 240d1, 240d2, 240d3, 240d4, and 240d5.

Figure 8B:
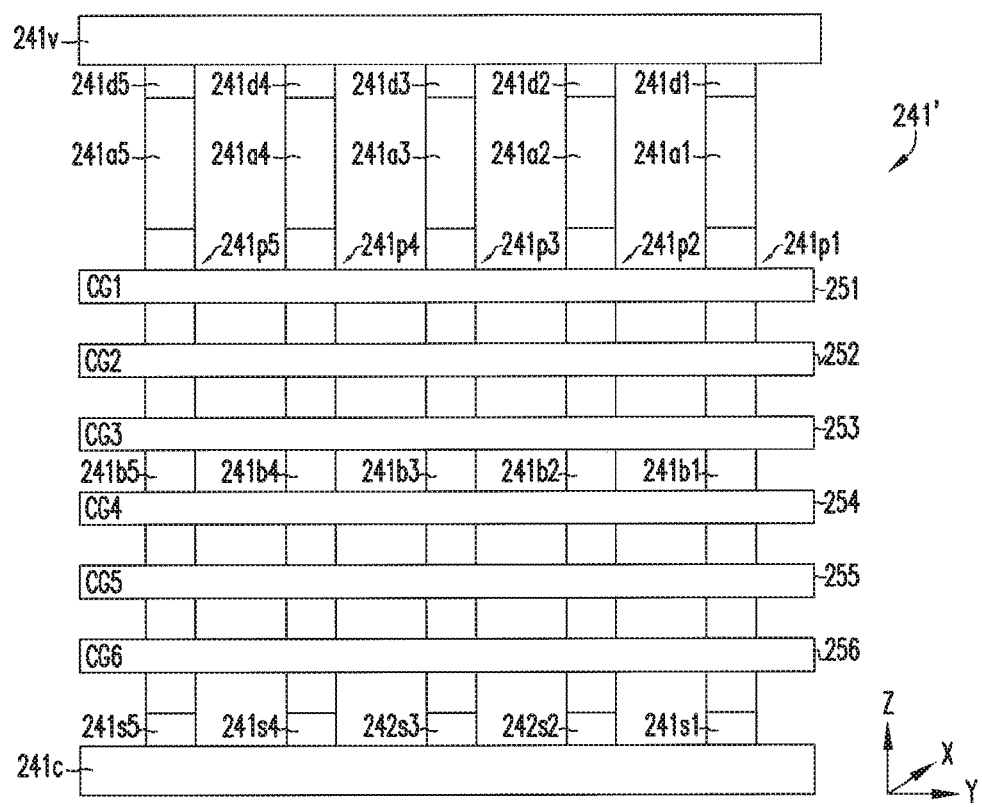
Figure 8C:
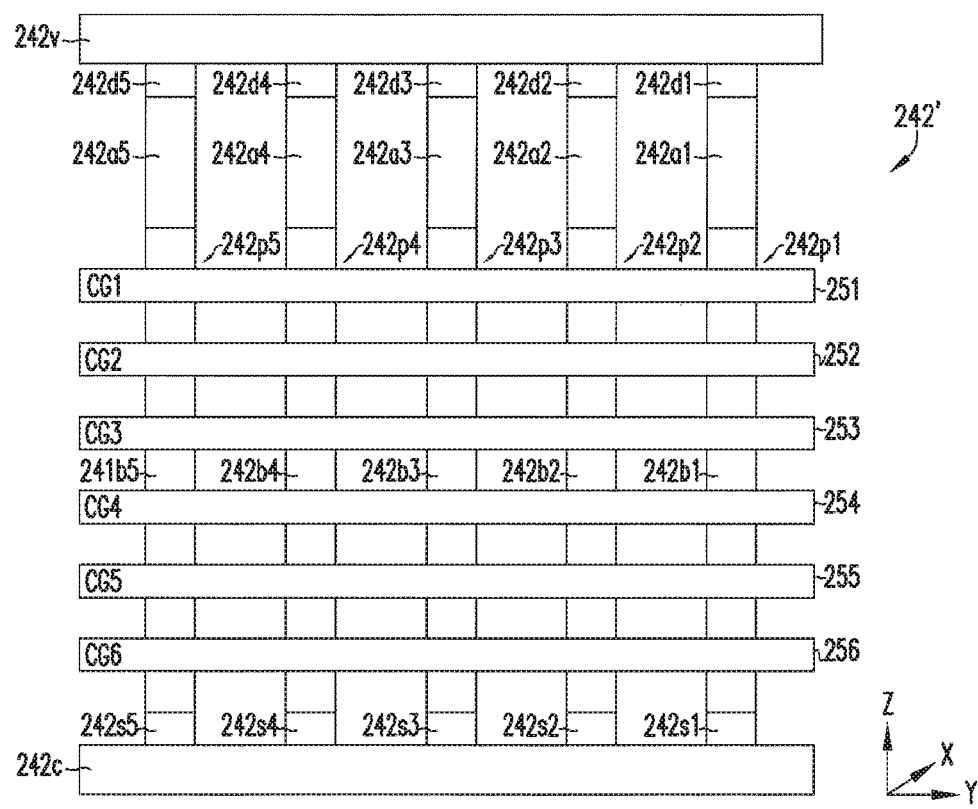

FIG. 8B shows a structure of a portion of memory device 700 of FIG. 7 including part of the structure of driver 241' along lines 8B-8B of FIG. 7, according to some embodiments described herein. As shown in FIG. 8B, portions (e.g., LDD structures) 241a1, 241a2, 241a3, 241a4, and 241a5 can be separated from each other (e.g., are not directly coupled to each other) and are formed over portions 241b1, 241b2, 241b3, 241b4, and 241b5, respectively. The separation of the structure of portions 241a1, 241a2, 241a3, 241a4, and 241a5 is different from the continuous structure (e.g., shared (or merged) structure) of portion 241a (e.g., LDD structure) of driver 241 in FIG. 5B. As shown in FIG. 8B, portions 241d1, 241d2, 241d3, 241d4, and 241d5 can be separated from each other and are formed over portions 241a1, 241a2, 241a3, 241a4, and 241a5, respectively. Conductive region 241v (e.g., part of a global access line) can be coupled to each of portions 241d1, 241d2, 241d3, 241d4, and 241d5, FIG. 8C shows a structure of a portion of memory device 700 of FIG. 7 including part of the structure of driver 242' along lines 8C-8C of FIG. 7, according to some embodiments described herein. As shown in FIG. 8C, portions (e.g., LDD structures) 242a1, 242a2, 242a3, 242a4, and 242a5 can be separated from each other (e.g., are not directly coupled to each other) and are formed over portions 242b1, 242b2, 242b3, 242b4, and 242b5, respectively. The separation of the structure of portions 242a1, 242a2, 242a3, 242a4, and 242a5 is different from the continuous structure (e.g., shared (or merged) structure) of portion 242a (e.g., LDD structure) of driver 242 in FIG. 5C. As shown in FIG. 8C, portions 242d1, 242d2, 242d3, 24244, and 242d5 can be separated from each other and are formed over portions 242a1, 242a2, 242a3, 242a4, and 242a5, respectively. Conductive region 242v (e.g., part of a global access line) can be coupled to each of portions 242d1, 242d2, 242d3, 242d4, and 242d5.

Figure 8D:
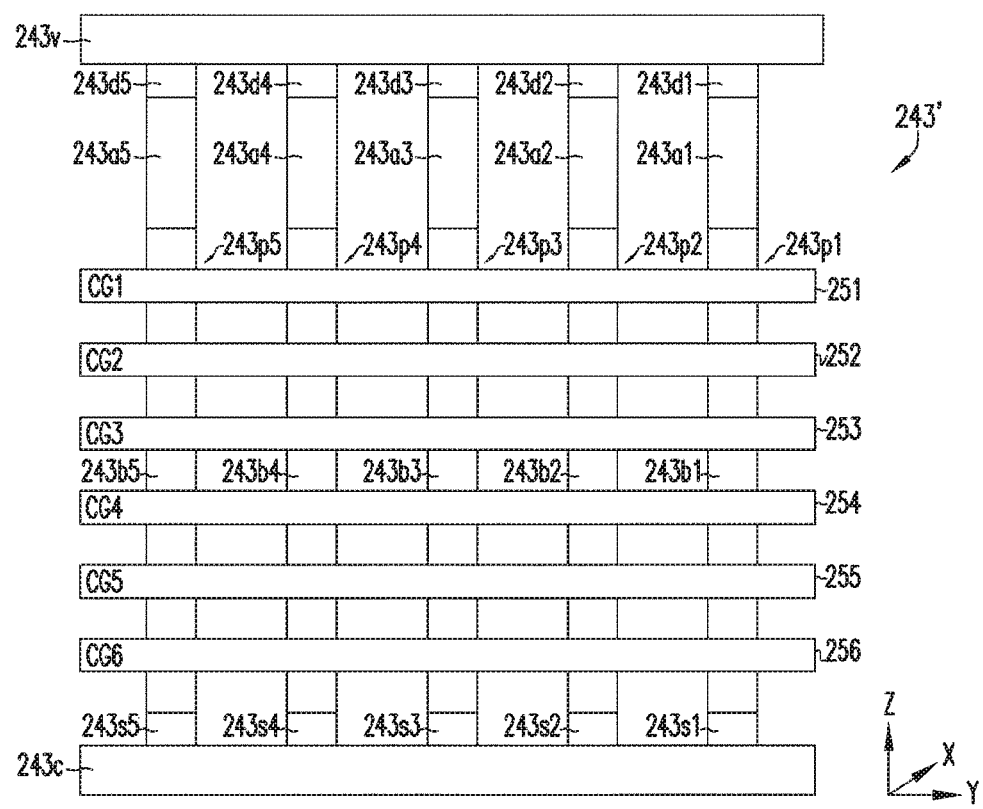
Figure 9:
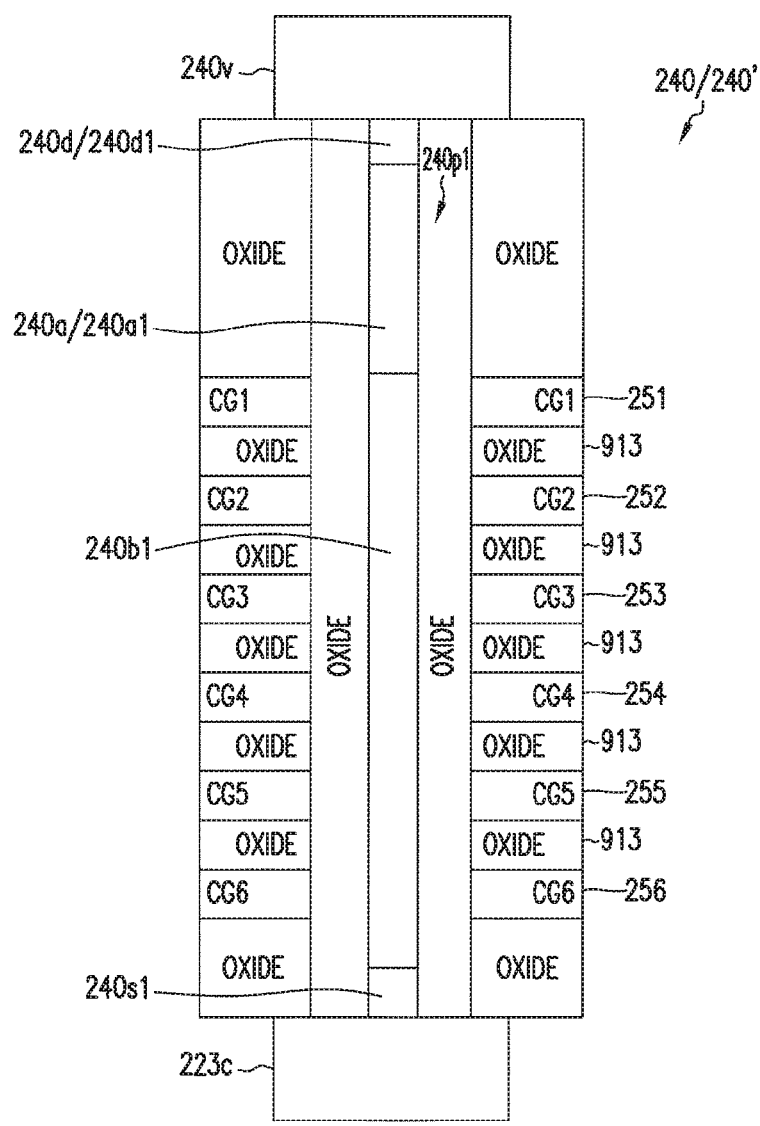
FIG. 9 shows details of a structure of a portion of a driver of the memory device of FIG. 4 and the memory device of FIG. 7, according to some embodiments described herein.

FIG. 8D shows a structure of a portion of memory device 700 of FIG. 7 including part of the structure of driver 243' along lines 8D-8D of FIG. 7, according to some embodiments described herein. As shown in FIG. 8D, portions (e.g., LDD structures) 243a1, 243a2, 243a3, 243a4, and 243a5 can be separated from each other (e.g., are not directly coupled to each other) and are formed over portions 243b1, 243b2, 243b3, 243b4, and 243b5, respectively. The separation of the structure of portions 243a1, 243a2, 243a3, 243a4, and 243a5 is different from the continuous structure (e.g., shared (or merged) structure) of portion 243a (e.g., LDD structure) of driver 243 in FIG. 5D. As shown in FIG. 8D, portions 243d1, 243d2, 243d3, 243d4, and 243d5 can be separated from each other and are formed over portions 243a1, 243a2, 243a3, 243a4, and 243a5, respectively. Conductive region 243v (e.g., part of a global access line) can be coupled to each of portions 243d1, 243d2, 243d3, 243d4, and 243d5.

FIG. 9 shows a structure of a portion of driver 240 of memory device 200 (FIG. 4) or driver 240' of memory device 600 (FIG. 6), according to some embodiments described herein. For simplicity, only one of the drivers (e.g., driver 240) of memory device 200 (FIG. 4) is described in detail in this description. Each of other drivers 241, 242, and 243 (FIG. 4) has a structure similar to the structure of driver 240 shown in FIG. 4. Similarly, each of drivers 241', 242', and 243' (FIG. 6) can also have a structure similar to the structure of driver 240 (or 240') shown in FIG. 9.

As shown in FIG. 9, control gates 251 through 256 (e.g., a group of conductive materials that form control gates 251 through 256) can be interleaved with a group of dielectric materials 913 (oxide materials are shown as an example for dielectric materials 913). Pillar 240p1 can contact conductive region 240v and conductive contact 223c at portions 240d and 240s1, respectively. For simplicity, the description below refers to driver 240 of FIG. 4. However, the description below can also be applied to drivers 240' of FIG. 6. For example, the description of portions 240d and 240a of driver 240 can also be applied to the description of portions 240d1 and 240a1, respectively, of driver 241.

As shown in FIG. 9, driver 240 (or driver 240') can include dielectric material 913 between pillar 240p1 and control gates 251 through 256 and surrounding pillar 240p1. Driver 240 can also include additional dielectric material (e.g., silicon dioxide) material surrounding portion 240d, and additional dielectric material (e.g., silicon dioxide) surrounding portion 240s11. As shown in FIG. 9, portion 240d can contact conductive region 240v, and portion 240s1 can contact conductive contact 220c.

FIG. 9 shows an example where the dielectric material between pillar 240p1 and control gates 251 through 256 is an oxide material (e.g., silicon dioxide (gate oxide)). However, the dielectric material between pillar 240p1 and control gates 251 through 256 can be different from silicon dioxide material. Examples of such dielectric material include high-k materials (materials having a dielectric constant higher than the dielectric constant of silicon dioxide, e.g., nitride, AlO, HfO, ZrO and other high-K materials). Alternatively, the dielectric material between pillar 240p1 and control gates 251 through 256 can be a combination of high-K materials and silicon dioxide material.

Pillar 240p1 can be asymmetrically configured, such that portions 240d, 240a, 240b1, and 240s1 can have the same material (e.g., polysilicon) but different doping concentration. The asymmetrical properties of pillar 240p1 can enhance operations of driver 240 and allow driver 240 to have improvements over some conventional drivers, as further discussed below.

In FIG. 9, portion 240a can have a doping concentration less than (e.g., 10 to 40 times less than) the doping concentration of each of portions 240d and 240s1. Portion 240b1 can be undoped or doped polysilicon. Portion 240b1 can have a doping concentration less than or close to (e.g., equal to) the doping concentration of portion 240a if portion 240b1 is doped.

As an example, portions 240d, 240a, and 240s1 can be polysilicon doped with impurities (e.g., dopants) in which portion 240d can have a doping concentration in the range of xe19 to xe21 per cm$^3$ (where x is a number greater than zero and less than 10), portion 240a can have a doping concentration in the range of xe17 to xe18 per cm$^3$, and portion 240s1 can have a doping concentration in the range of xe19 to xe21 per cm$^3$. In this example, portion 240b1 can have a doping concentration close to (e.g., equal to) or less than the doping concentration of portion 240a, or alternatively, portion 240b1 can be undoped polysilicon.

As shown in FIG. 9, portion 240d has a vertical dimension (e.g., a length in the z-direction between conductive region 240v and portion 240a). Portion 240a has a vertical dimension (e.g., a length in the z-direction between portions 240d and 240b1). The vertical dimension of portion 240a can be greater (e.g., at least two times greater) than the vertical dimension of portion 240d.

Portion 240a can be formed by deposition, such that the material (e.g., lightly doped polysilicon) of portion 240a can have a grain size of approximately 10 nm (nanometers) to 20 nm. In an alternative structure of memory device 200, portion 210a can be formed by techniques such as metal-induced crystallization, laser anneal, or low-temperature anneal. In such an alternative structure, portion 240a can include a material (e.g., a silicon-like material), in which such a material can have a grain size of approximately greater than 150 nm (e.g., a grain size of approximately 200 nm, which can be at least 10 times the grain size of a typical lightly doped polysilicon). In such an alternative structure, portion 240a can have a grain size greater than a grain size of portion 240b1.

As described above with referenced to FIG. 2 through FIG. 9, driver 240 can be turned on (e.g., can be placed in an on-state) to form a conductive path through pillar 240p1. Driver 240 can be turned off (e.g., can be placed in an off-state) to not form a conductive path through pillar 240p1. A relatively high voltage (e.g., V5=30V) can be applied to each of control gates 251 through 256 to turn on driver 240. This can create a relatively good current path through pillar 240p1 of a respective driver.

A voltage of zero volts (0V) can be applied to one or all of control gates 251 through 256 to turn off driver 240. However, in order to allow driver 240 to support a relatively higher breakdown voltage (e.g., a breakdown voltage BV of 30V or higher) at the area near portion 240d (e.g., drain side of pillar 240p1) and at the area near portion 240s1 (e.g., source side of pillar 240p1), voltages having different values in addition to a voltage of 0V can be applied to control gates 251 through 256 when driver 240 is placed in the off-state.

For example, during an erase operation to erase information from memory cells 210, 211, 212, and 213 (FIG. 2), a relatively high voltage (e.g., Verase=30V) can be applied to data line 270 and line 299. This condition can increase the potential of pillar 240*p*1 (FIG. 9) to approximate the value of voltage Verase. The increase may exceed the breakdown voltage of driver 240 and cause damage to pillar 240*p*1 if control gates 251 through 256 are improperly controlled. As described below, the structure of driver 240 (or 240') in FIG. 9 allows different sets of voltages to be applied to control gates 251 through 256 in order to reduce charging capacitance (e.g., gate-to-channel capacitance) during a write (program) operation of memory device 200 to provide support for a relatively high (e.g., 30V or higher) breakdown voltage, and provide an improved current (e.g., Ion) drive through pillar 240*p*1 of driver 240.

As an example, during a write operation of memory device 200, control gates 251 through 256 can be applied with voltages having values (e.g., in sequentially decreasing values from control gate 251 to 256) of 10V, 9V, 4V, 0V, 0V, and 0V, respectively. In another example, during an erase operation of memory device 200, control gates 251 through 256 can be applied with voltages having values (e.g., in sequentially increasing values from control gate 251 to 256) of 0V, 0V, 10V, 16V, 23V, and 30 volts, respectively.

Thus, in a write operation, the control gate (e.g., control gate 251 at the drain side of pillar 240*p*1) that is closest to conductive region 240*v* (e.g., global word line side) can be applied with a higher voltage (e.g., 10V) than the voltage (e.g., 0V) applied to the control gate (e.g., control gate 256 at the source side pillar 240*p*1) that is closest to conductive contact 223*c* (e.g., local word line side).

The structure of driver 240 (or 240') allows it to have improvements and benefits over some conventional drivers. For example, some conventional drivers may have a multi-gate structure. However, in such a structure, the gates of the conventional driver may be biased at a relatively high voltage value at the gate at the edges and a lower voltage value for the gates toward the center in order to support a relatively high breakdown voltage (e.g., drain side breakdown voltage of 30V or higher). Such a bias scheme in the conventional driver may cause the transistor controlled by the edge gates to turn on, thereby increasing the total charging capacitance from unselected memory cell strings associated with the conventional driver. This may make peripheral circuitry more complex.

In driver 240 of FIG. 9, the inclusion of portion 240*a* combined with portions 240*d*, 240*b*1 and 240*s*1 of pillar 240*p*1 may allow reduction in the value of the voltage (e.g., V0) applied to the control gate (e.g., drain side edge control gate) closest to conductive region 240*v* (e.g., global word line side). For example, a voltage of approximately 10V (e.g., instead of 30V) can be applied to control gate 251 (as also described above) during a write operation of memory device 200. This relatively lower voltage (in comparison with the voltage applied to the edge gate of some conventional drivers) used in driver 240 (or driver 240') can help weakly or strongly turn off the transistor control by the edge control gate, thereby reducing the total charging capacitance.

Further, during an erase operation of memory device 200, the total charging capacitance may have a relatively small impact in the operation of driver 240. Therefore, a relatively high voltage (e.g., 30V) can be applied to the control gate (e.g., source side edge control gate) closest to conductive contact 223*c* (e.g., local word line side). This allows driver 240 to have an improved current (e.g., Ion) drive Moreover, as described above, instead of a relatively lightly doped polysilicon, portion 240*a* can have an alternative structure, such as a silicon-like structure. Such an alternative structure can allow driver 240 to achieve a higher breakdown voltage (relative to the improved breakdown voltage supported by driver 240) and higher current (e.g., Ion) drive because of fewer defects, larger grains, or both, that the alternative structure (e.g., silicon-like structure) may provide.

Additionally, as described above with reference to FIG. 2 through FIG. 5D related to memory device 200, a relatively larger grain size of portion 240*a* can improve on/tiff current properties of the driver 240. A relatively large portion 240*a* can reduce resistance that flows through portion 240*a* of driver 240.

FIG. 9 shows an example where portion 240*b*1 can be a solid (e.g., not hollow) structure (e.g., a solid channel). However, portion 240*b*1 can have a hollow structure.

Figure 10:
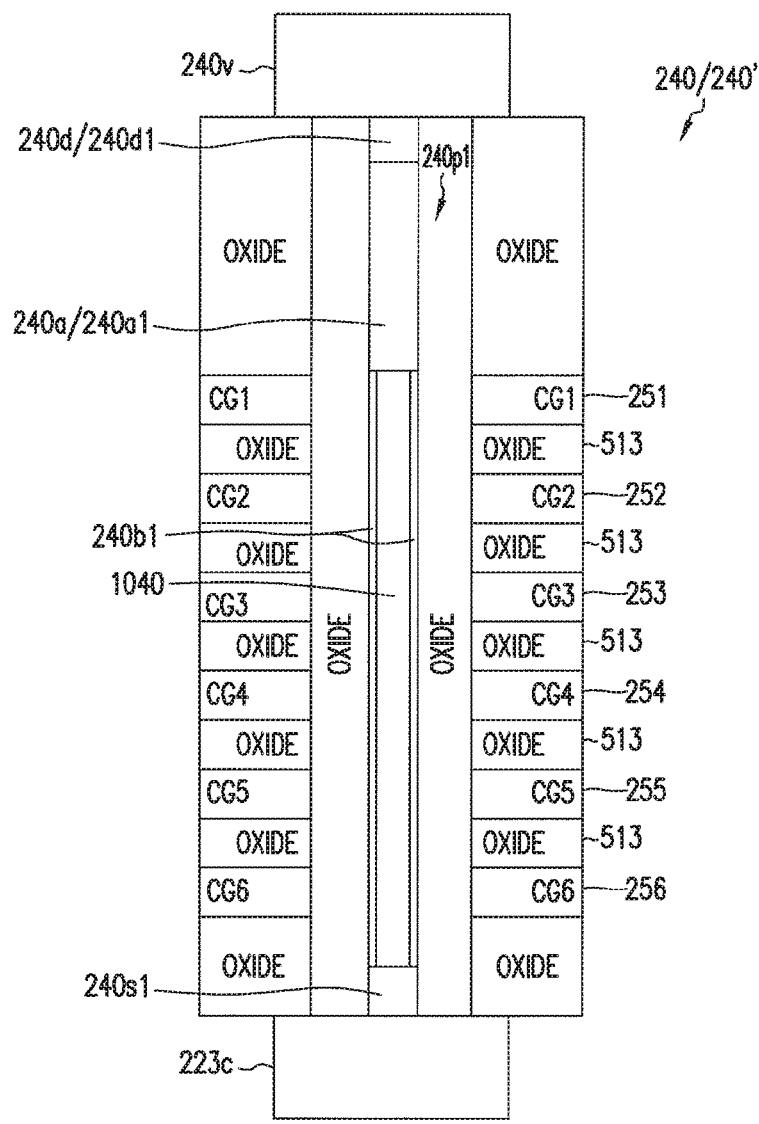
FIG. 10 shows details of a structure of a portion of a driver of the memory device of FIG. 4 and the memory device of FIG. 7 having a hollow channel structure, according to some embodiments described herein.

FIG. 10 shows a structure of a portion of driver 240 of memory device 200 (FIG. 4) or driver 240' of memory device 600 (FIG. 6) where portion 240*b*1 can have a hollow channel structure, according to some embodiments described herein. As shown in FIG. 10, driver 240 (or driver 240') can include a portion 1040 surrounded by portion 240*b* such that portion 240*b*1 is not a solid portion in comparison with portion 240*b*1 of FIG. 9. Portion 1040 can include a dielectric (e.g., silicon dioxide).

FIG. 11 through FIG. 17 show processes of forming a memory device 1100 including forming a driver 1140' having separate LDD structures having a relatively large grain size, according to some embodiments described herein. Memory device 1100 can include elements similar to the elements of memory device 700 of FIG. 7. Thus, for simplicity, similar or identical elements between memory devices 700 and 1100 are given the same labels and the description of such similar or identical elements is not repeated.

Figure 11:
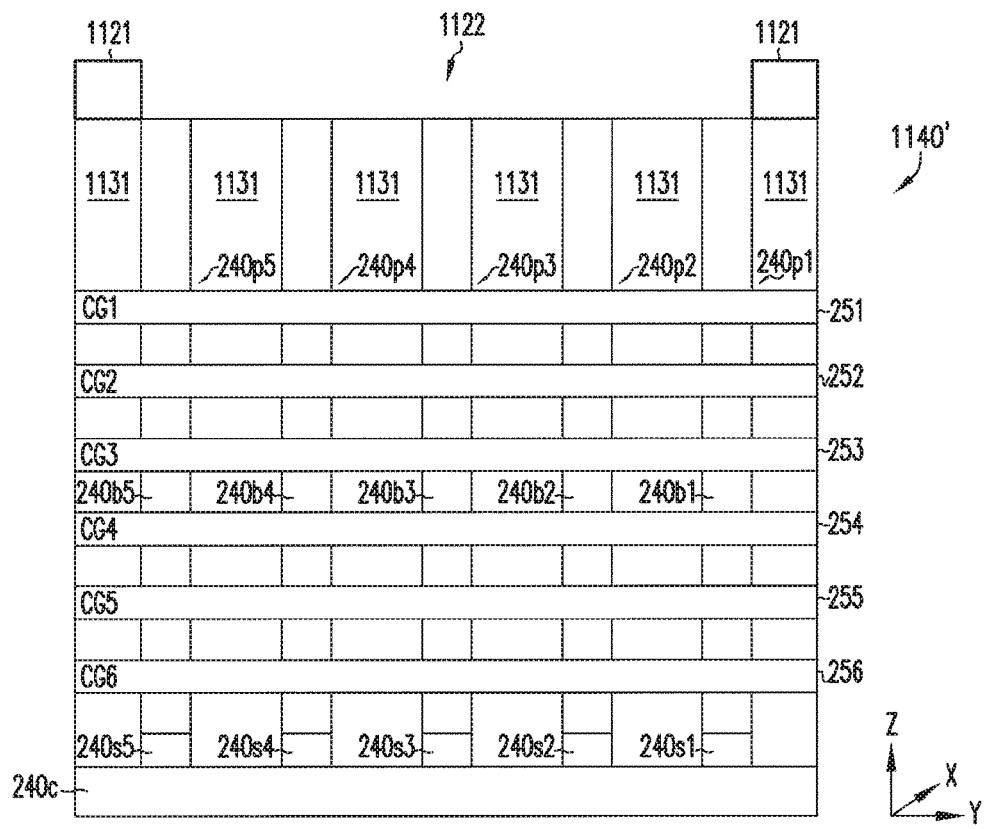
FIG. 11 through FIG. 17 show processes of forming a memory device including forming a driver having separate lightly doped structures, according to some embodiments described herein.

The elements of memory device 1100 shown in FIG. 11 can be formed by processes known to those skilled in the art. As shown in FIG. 11, driver 1140' can include elements (e.g., pillars 240*p*1, 240*p*2, 240*p*3, 240*p*4, and 240*p*5) similar to those of driver 240' of FIG. 8A. In FIG. 11, memory device 1100 can include dielectric (e.g., silicon dioxide) 1131 formed over control gate 251 and between pillars 240*p*1, 240*p*2, 240*p*3, 240*p*4, and 240*p*5. FIG. 11 also shows memory device 1100 after a mask 1121 is formed over dielectric 1131. Mask 1121 can have an opening 1122 that exposes portions of dielectric 1131. Opening 1122 can also expose a portion. (e.g., top portion) of each of pillars 240*p*1, 240*p*2, 240*p*3, 240*p*4, and 240*p*5 at opening 1122.

Figure 12:
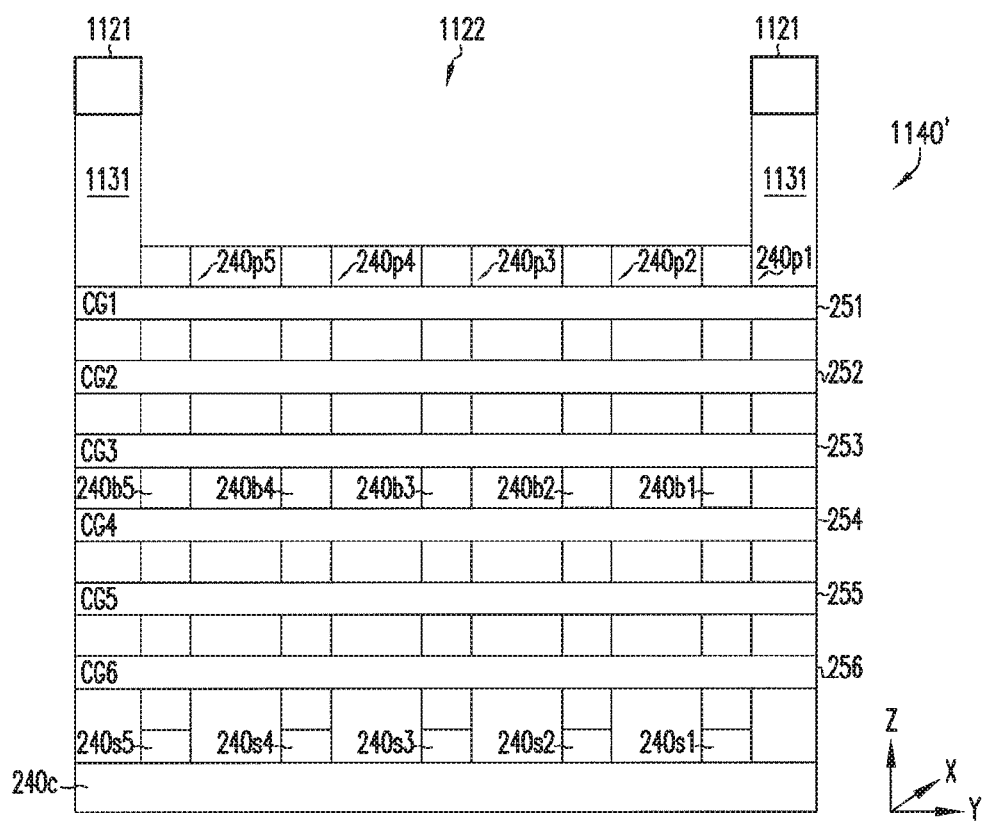

FIG. 12 shows memory device 1100 after a portion of dielectric 1131 and a portion (e.g., top portion) of each of pillars 240*p*1, 240*p*2, 240*p*3, 240*p*4, and 240*p*5 at opening 1122 were removed.

Figure 13:
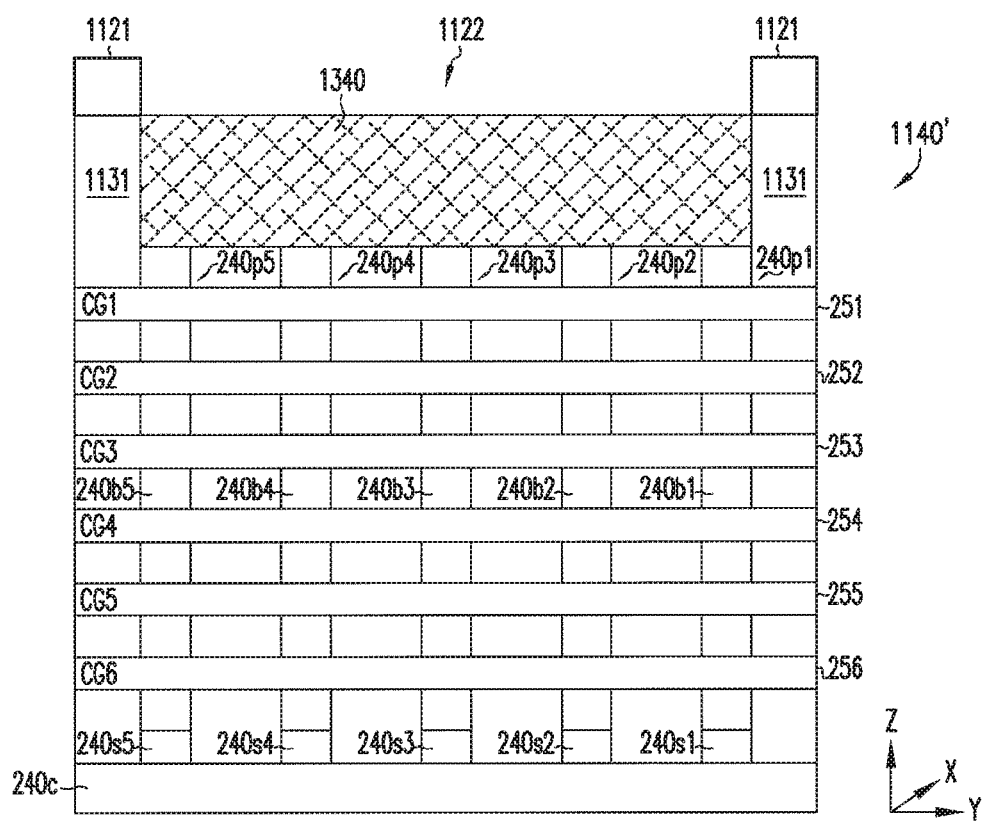

FIG. 13 shows memory device 1100 after a material (or materials) 1340 is formed (e.g., deposited) over a portion of dielectric 1131 and over a portion of each of pillars 240*p*1, 240*p*2, 240*p*3, 240*p*4, and 240*p*5 at opening 1122. Material 1340 can include polysilicon. A hatched pattern is included in FIG. 13 at material 1340 to symbolically show a structure (e.g., a state) of the polysilicon of material 1340 having a relatively high level of defects (e.g., material 1340 can be silicon-like (pseudo-polysilicon) structure). Such structure of the polysilicon of material 1340 can have a relatively small grain size (e.g., a grain size of approximately 10 nm to 20 nm).

The polysilicon of material 1340 can be doped with impurities (e.g., dopants), such that a doping concentration of polysilicon of material 1340 can be lightly doped to be less than a doping concentration of pillar portions (e.g., portions 240d1, 240d2, 240d3, 240d4, and 240d5) which will be formed in subsequent processes.

Figure 14:
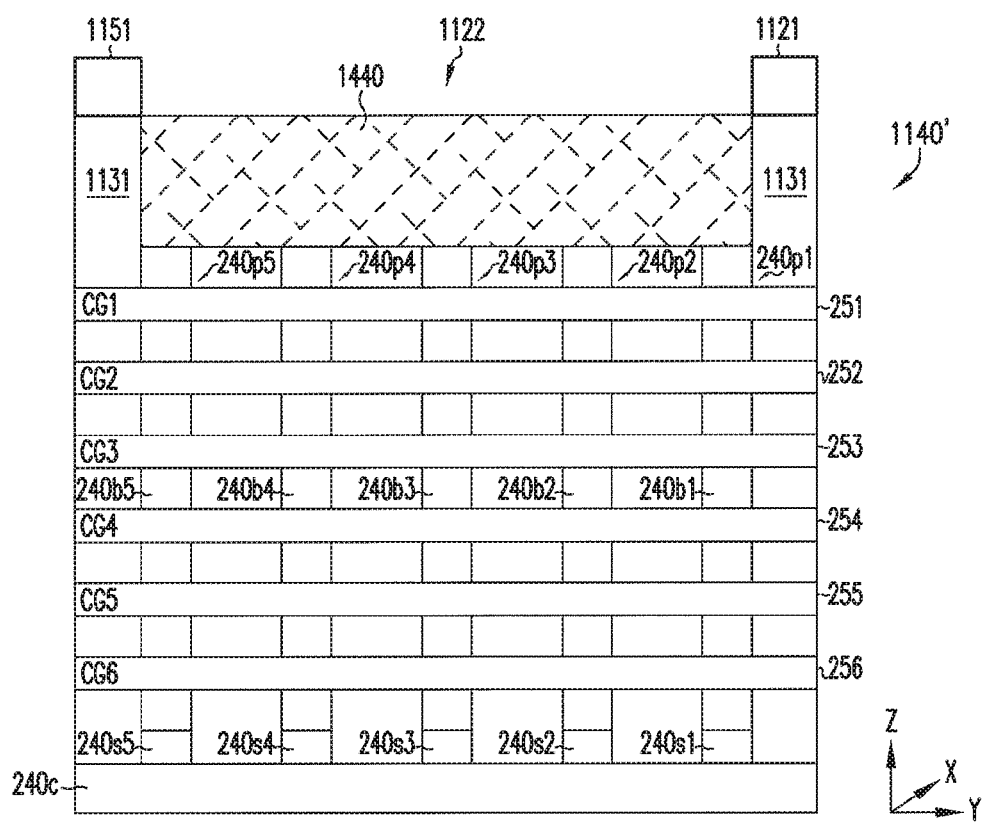

FIG. 14 shows memory device 1100 after material (or materials) 1440 has been formed. Forming material 1440 can include causing (e.g., engineering including annealing) material 1340 of FIG. 13 to increase the grain size (and reduce defects) in the structure of the polysilicon of material 1340. FIG. 14 shows a different hatched pattern at material 1440 to symbolically show a structure of the polysilicon of material 1440 is different from the structure of the polysilicon of material 1340 of FIG. 13. For example, in such a structure of the polysilicon of material 1440, the grain size of the polysilicon of material 1440 (e.g., as a result of the conditioning of material 1340 of FIG. 13) can be different from (e.g., greater than) the grain size of the polysilicon of material 1330 of FIG. 13. For example, the grain size of the polysilicon of material 1440 of FIG. 14 can be approximately greater than 150 nm (e.g., a grain size of approximately 200 nm, which can be at least 10 times the grain size of the polysilicon of material 1340 of FIG. 13). The structure of the polysilicon of material 1440 can also have fewer defects than the structure of the polysilicon of material 1340 of FIG. 13.

Figure 15:
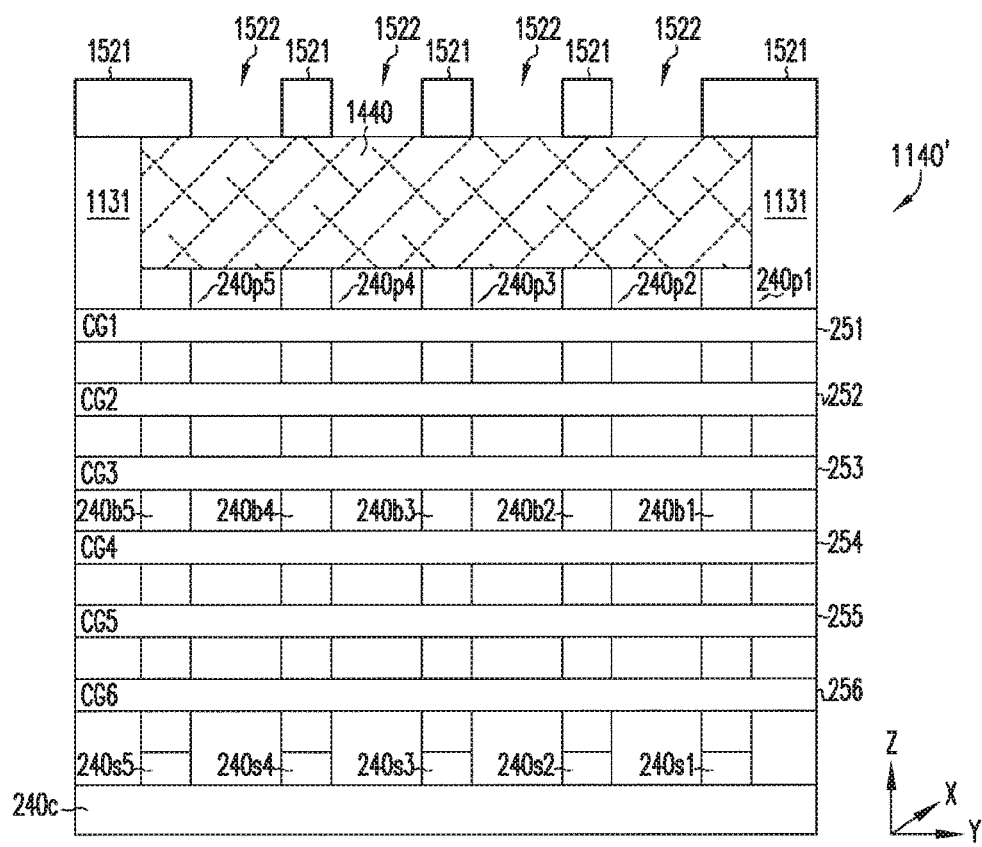

FIG. 15 shows memory device 1100 after a mask 1521 is formed over dielectric 1131 and over material 1440. Mask 1521 can have openings 1522 that expose portions of material 1440 at openings 1522.

Figure 16:
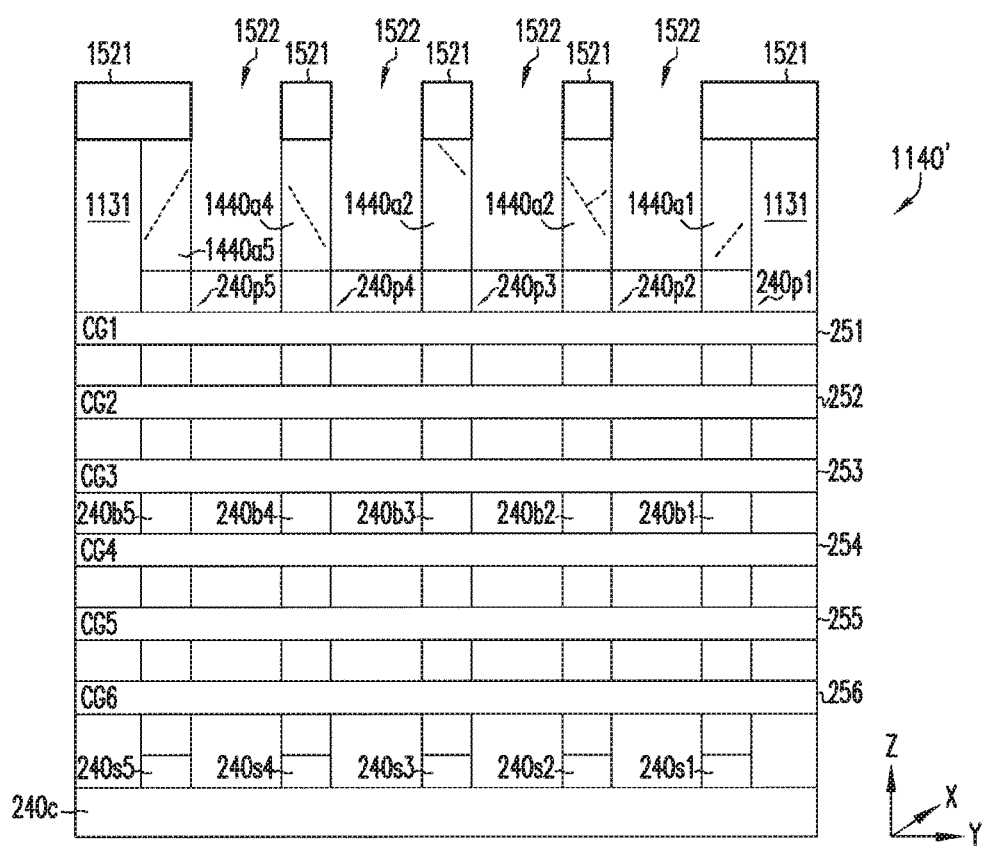

FIG. 16 shows memory device 1100 after portions of material 1440 at openings 1522 were removed. The remaining separate portions of material 1440 can form portions (e.g., LDD structures) 1440a1, 1440a2, 1440a3, 1440a4, and 1440a5 that contact responding portions (e.g., channels) 240b1, 240b2, 240b3, 240b4, and 240b5, of pillars 240p1, 240p2, 240p3, 240p4, and 240p5, respectively. Portions 1440a1, 1440a2, 1440a3, 1440a4, and 1440a5 can have a grain size greater than a grain size of portions 240b1, 240b2, 240b3, 240b4, and 240b5, respectively.

Portions 1440a1, 1440a2, 1440a3, 1440a4, and 1440a5 can correspond to portions 240a1, 240a2, 240a3, 240a4, and 240a5, respectively, of FIG. 8A. Each of portions 1440a1, 1440a2, 1440a3, 1440a4, and 1440a5 can also correspond to portion 240a1 of FIG. 9. Thus, forming portions (e.g., LLD structures) 1440a1, 1440a2, 1440a3, 1440a4, and 1440a5 that have a relatively large grain size can allow memory device 1100 to have improvements and benefits similar to those of the memory devices described above with reference to FIG. 2 through FIG. 10.

Figure 17:
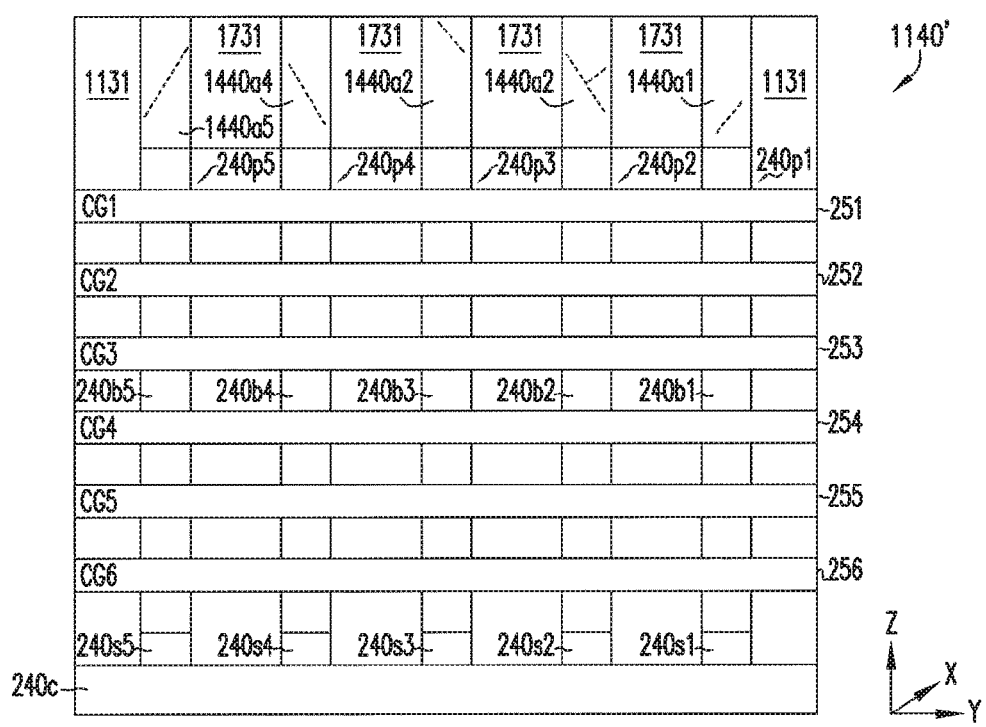

FIG. 17 shows memory device 1100 after dielectric (e.g., silicon dioxide) 1731 is formed (e.g., deposited) over portions of dielectric 1131 and between portions 1440a1, 1440a2, 1440a3, 1440a4, and 1440a5. FIG. 17 also shows memory device 1100 after mask 1521 is removed.

The processes of forming memory device 1100 can include additional (e.g., subsequent) processes performed after the processes of forming memory device 1100 shown in FIG. 17. Such additional processes can be performed in ways know to those skilled in the art. For example, such additional processes can include forming portions of memory devices 1100 that are similar to portions 240d1, 240d2, 240d3, 240d4, and 240d5, and conductive region 240v of FIG. 8A.

The illustrations of apparatuses (e.g., memory devices 100, 200, 600, 700, and 1100) and methods (e.g., operating methods associated with memory devices 100 and 200 and methods of forming memory device 1100) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 600, 700, and 1100) or a system (e.g., a computer, a cellular phone, or other electronic systems) that includes a device such as any of memory devices 100, 200, 600, 700, and 1100.

Any of the components described above with reference to FIG. 1 through FIG. 17 can be implemented in a number of ways, including simulation via software. Thus, apparatuses (e.g., memory devices 100, 200, 600, 700, and 1100 or part of each of these memory devices, including a control unit in these memory devices, such as control unit 118 (FIG. 1)) described above may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 600, 700, and 1100 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 17 include apparatuses, and methods operating the apparatuses. Some of the apparatuses include a first group of conductive materials interleaved with a first group of dielectric materials, a pillar extending through the conductive materials and the dielectric materials, memory cells located along the first pillar, a conductive contact coupled to a conductive material of the first group of conductive materials, and additional pillars extending through a second group of conductive materials and a second group of dielectric materials. The second pillar includes a first portion coupled to a conductive region, a second portion, a third portion, and a fourth portion coupled to the conductive contact. The second portion is located between the first and third portions. The second portion of each of the additional pillars is part of a piece of material extending from a first pillar to a second pillar of the additional pillars. Other embodiments including additional apparatuses and methods are described.

In the detailed description and the claims, a list of items joined by the term "one of" can mean any of the listed items. For example, if items A and B are listed, then the phrase "one of A and B" means A only or B only. In another example, if items A, and C are listed, then the phrase "one of A, B and C" means A only; B only; or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only; B only; or A and B. In another example, if items A, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
    a first group of conductive materials interleaved with a first group of dielectric materials;
    a pillar extending through the first group of conductive materials and the first group of dielectric materials;
    memory cells located along the pillar;
    a conductive contact coupled to a conductive material of the first group of conductive materials;
    additional pillars extending through a second group of conductive materials and a second group of dielectric materials, each of the additional pillars including a first portion, a second portion, a third portion, and a fourth portion, the second and third portions located between the first and fourth portions, and the second portion located between the first and third portions, wherein the first portion is coupled to a conductive region; and
    the fourth portion is coupled to the conductive contact, and wherein the second portion of each of the additional pillars is part of a piece of material extending from a first pillar of the additional pillars to a second pillar of the additional pillars.

2. The apparatus of claim 1, wherein the piece of material has a doping concentration less than a doping concentration of each of the first and fourth portions of each of additional pillars.

3. The apparatus of claim 1, wherein the first portion has a first length, the second portion has a second length, and the second length is greater than the first length.

4. The apparatus of claim 3, wherein the first length extends in a direction perpendicular to the first group of conductive materials.

5. The apparatus of claim 1, wherein the second portion is doped polysilicon.

6. The apparatus of claim 1, wherein second portion has a grain size greater than 150 nanometers.

7. The apparatus of claim 1, wherein the third portion has a doping concentration less than the concentration of the second portion.

8. The apparatus of claim 1, wherein the third portion is doped polysilicon.

9. The apparatus of claim 1, wherein the third portion is undoped polysilicon.

10. The apparatus of claim 1, wherein the memory cells are located in levels of the apparatus between a substrate and the second pillar.

11. The apparatus of claim 1, wherein the second group of conductive materials are polysilicon.

12. The apparatus of claim 1, wherein the second group of conductive materials are metal.

13. The apparatus of claim 1, wherein the third portion includes polysilicon surrounding a first dielectric.

14. The apparatus of claim 13, wherein the second portion includes polysilicon surrounding a second dielectric.

15. The apparatus of claim 1, wherein the apparatus comprises a memory device, the first group of conductive materials form part of a group of word lines of the memory device, and the additional pillars are included in a driver to provide a voltage to one of the word lines.

16. An apparatus comprising:
    a first group of conductive materials interleaved with a first group of dielectric materials;
    a pillar extending through the first group of conductive materials and the first group of dielectric materials;
    memory cells located along the first pillar;
    a conductive contact coupled to a conductive material of the first group of conductive materials;
    first additional pillars extending through a second group of conductive materials and a second group of dielectric materials, the second group of conductive materials located on different levels of the apparatus and interleaved with the second group of dielectric materials;
    second additional pillars extending through the second group of conductive materials and the second group of dielectric materials;
    a first piece of material shared by the first additional pillars, such that a portion of each of the first additional pillars is included in the first piece of material; and
    a second piece of material shared by the second additional pillars, such that a portion of each of the second additional pillars is included in the second piece of material.

17. The apparatus of claim 16, wherein the first piece of material includes polysilicon, and the second piece of material includes polysilicon.

18. The apparatus of claim 16, wherein the first piece of material is electrically separated from the second piece of material.

19. The apparatus of claim 16, wherein the first additional pillars are arranged in a first single row, and the second additional pillars are arranged in a second single row.

20. The apparatus of claim 16, wherein the first additional pillars are arranged in first rows, and the second additional pillars are arranged in second multiple rows.

21. An apparatus comprising:
- a first group of conductive materials interleaved with a first group of dielectric materials;
- a pillar extending through the first group of conductive materials and the first group of dielectric materials;
- memory cells located along the first pillar;
- a conductive contact coupled to a conductive material of the first group of conductive materials;
- first additional pillars extending through a second group of conductive materials and a second group of dielectric materials;
- second additional pillars extending through the second group of conductive materials and the second group of dielectric materials;
- a first piece of material shared by the first additional pillars, such that a portion of each of the first additional pillars is included in the first piece of material; and
- a second piece of material shared by the second additional pillars, such that a portion of each of the second additional pillars is included in the second piece of material, wherein:
- the first piece of material contacts a portion of each of the first additional pillars, and the first piece of material has grain size greater than a grain size of the portion of each of the first additional pillars; and
- the second piece of material contacts a portion of each of the second additional pillars, and the second piece of material has grain size greater than a grain size of the portion of each of the second additional pillars.

* * * * *